US006830865B2

(12) United States Patent
Tsuchimura et al.

(10) Patent No.: US 6,830,865 B2
(45) Date of Patent: Dec. 14, 2004

(54) POSITIVE-TYPE IMAGE-FORMING MATERIAL AND PLANOGRAPHIC PRINTING PLATE PRECURSOR

(75) Inventors: Tomotaka Tsuchimura, Shizuoka-ken (JP); Ippei Nakamura, Shizuoka-ken (JP); Akio Oda, Shizuoka-ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 149 days.

(21) Appl. No.: 10/077,943

(22) Filed: Feb. 20, 2002

(65) Prior Publication Data

US 2002/0160300 A1 Oct. 31, 2002

(30) Foreign Application Priority Data

Feb. 20, 2001 (JP) ....................................... 2001-043163

(51) Int. Cl.[7] ................................................ G03F 7/004
(52) U.S. Cl. .................................... 430/270.1; 430/964
(58) Field of Search ............................. 430/270.1, 302, 430/348, 964

(56) References Cited

U.S. PATENT DOCUMENTS

| | | | | |
|---|---|---|---|---|
| 4,708,925 A | * | 11/1987 | Newman | 430/270.1 |
| 5,663,037 A | * | 9/1997 | Haley et al. | 430/278.1 |
| 6,451,497 B1 | * | 9/2002 | Kunita | 430/191 |
| 2003/0170559 A1 | * | 9/2003 | Mizutani et al. | 430/270.1 |

FOREIGN PATENT DOCUMENTS

| | | |
|---|---|---|
| EP | 0 949 539 A2 | 10/1999 |
| EP | 1 053 999 A2 | 11/2000 |
| JP | 2000-338670 | 12/2000 |

* cited by examiner

*Primary Examiner*—Barbara L. Gilliam
(74) *Attorney, Agent, or Firm*—Burns, Doane, Swecker & Mathis, L.L.P.

(57) ABSTRACT

A positive-type image-forming material and a planographic printing plate precursor having a recording layer composed of the material on a support. The material includes (a) a water-insoluble, aqueous alkaline solution-soluble polymer compound, (b) a light-heat converting agent, and (c) a phenol including a partial structure represented by the following formula (I). Solubility of the material in an aqueous alkaline solution is increased upon heating. In the formula (I), X represents a monovalent terminal group having 2 or more carbon atoms or a linking group of $—CY^1Y^2—$ or $—CHY^1—$ in which $Y^1$ and $Y^2$ each represent a monovalent terminal group having 1 or more carbon atoms, W represents a monovalent terminal group, and n represents an integer from 1 to 4.

Formula (I)

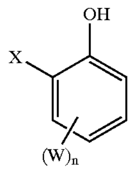

14 Claims, No Drawings

POSITIVE-TYPE IMAGE-FORMING MATERIAL AND PLANOGRAPHIC PRINTING PLATE PRECURSOR

BACKGROUND OF THE PRESENT INVENTION

1. Field of the Invention

The present invention relates to a positive-type image-forming material which enables image recording by exposure to an infrared laser and increases solubility of a recording layer of an exposed area, and a planographic printing plate precursor using the same. More specifically, it relates to an image-forming material which enables writing by heating through exposure to a near infrared region of an infrared laser or the like and which is especially appropriate for a planographic printing plate precursor for so-called direct plate-making in which plate-making can directly be conducted from digital signals of a computer or the like.

2. Description of the Related Art

In recent years, with the development of a solid state laser and a semiconductor laser having an emission region from a near infrared region to an infrared region, the use of these infrared lasers has attracted much interest as a system of direct plate-making from digital data of a computer.

A positive-type planographic printing plate precursor for an infrared laser which is used for direct plate-making is disclosed in Japanese Patent Application Laid-Open (JP-A) No. 285,275/1995. This invention is an image recording material obtained by adding a substance which absorbs light to generate heat and a positive-type photosensitive compound such as a quinonediazide compound to an aqueous alkaline solution-soluble resin, in which an image is formed such that the positive-type photosensitive compound acts as a dissolution inhibitor to substantially decrease solubility of the aqueous alkaline solution-soluble resin in an image area whereas it does not exhibit dissolution inhibitory properties through heat decomposition and is removed by development in a non-image area. Since quinonediazide compounds are photosensitive materials, an image recording material containing the same is problematic in that, for example, discoloration tends to occur when handled under a white lamp. Meanwhile, without the addition of quinonediazide compounds, a positive image can be obtained. However, in an image recording material from which the quinonediazide compound is excluded, there arises a defect that stability of sensitivity to varying concentrations of a developing solution, namely, a development latitude, is worsened.

Generally, in a positive-type planographic printing plate material capable of recording through heating with an infrared laser, a difference between a dissolution resistance to a developing solution of an unexposed area (image area) and a solubility of an exposed area (non-image area) under various use conditions is not satisfactory, and there has been a problem that excess development or insufficient development tends to occur owing to change in use conditions. Further, there have been problems that even when the surface condition is affected by a minute change by, for example, a touch to the surface in handling, an unexposed area (image area) is caused to dissolve during development, leading to formation of a defect, and further causes a shortened press life or poor ink-receptivity.

Such problems result from a substantial difference in plate-making mechanism between a positive-type planographic printing plate material used for an infrared laser exposure and a positive-type planographic printing plate material used for plate-making through UV exposure. That is, in a positive-type planographic printing plate material used for plate-making through UV exposure, an aqueous alkaline solution-soluble binder resin and onium salts or quinonediazide compounds are included as essential components, and the onium salts or quinonediazide compounds not only act as a dissolution inhibitor through interaction with a binder resin in an unexposed area (image area) but also serve as a dissolution accelerator by generating an acid through decomposition by light in an exposed area (non-image area), thus playing two roles.

On the other hand, IR dyes and other dyes included in a positive-type planographic printing plate material used with an infrared laser merely act as a dissolution inhibitor for an unexposed area (image area), and do not act to accelerate dissolution in an exposed area (non-image area). Accordingly, in order to exhibit a difference in solubility between an unexposed area and an exposed area, a positive-type planographic printing plate material used for an infrared laser is required to employ a resin having a high solubility in an alkaline developing solution as a binder resin from the start, resulting in an unstable condition before development. As such, a positive-type planographic printing plate material has a limitation in storage conditions before recording and has a problem in improving storability with the passing of time.

With respect to improvement of a development latitude, for example, in order to increase dissolution resistance to a developing solution at an unexposed area (image area) without impairing developability of an exposed area (non-image area), JP-A No. 1-288,093 proposes a method which uses a copolymer composed of an addition-polymerizable fluoro-containing monomer having in a side chain a fluoro-aliphatic group in which a hydrogen atom bonded to a carbon atom has been substituted with a fluorine atom, and EP 950517 proposes a method which uses a siloxane-based surfactant. Although these methods may contribute to improve resistance to development at an image area in the recording layer to some extent, a difference in solubility between an unexposed area and an exposed area is not large enough to form a sharp and good image considering fluctuation of activity of a developing solution.

SUMMARY OF THE PRESENT INVENTION

It is an object of the present invention to provide a positive-type image-forming material which is excellent in latitude during image-forming through development and in scratch resistance and good in storability, and also to provide a positive-type planographic printing plate precursor which has a recording layer exhibiting such excellent properties and can be used for direct plate-making using an infrared laser.

The present inventors conducted extensive researches to improve development latitude, scratch resistance and storability, and found that the foregoing objects can be attained by addition of a phenol compound having a specific structure. This finding has led to completion of the present invention.

That is, the present invention provides the following.

<1> A heat mode-compatible positive-type image-forming material including: (a) a water-insoluble, aqueous alkaline solution-soluble polymer compound (hereinafter occasionally referred to as an alkali-soluble resin), (b) a light-heat converting agent and (c) a phenol including a partial structure represented by the following formula (I) (hereinafter occasionally referred to as a specific phenol compound), the positive-type image-forming material exhibiting an increase in solubility in an aqueous alkaline solution when the positive-type image-forming material is heated:

Formula (I)

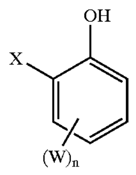

wherein: X represents a monovalent terminal group having 2 or more carbon atoms or a linking group represented by —$CY^1Y^2$— or —$CHY^1$— in which $Y^1$ and $Y^2$ each represent monovalent terminal groups having 1 or more carbon atoms; W represents a monovalent terminal group; and n represents an integer of 1 to 4.

<2> A planographic printing plate precursor in which a recording layer made of a positive-type image-forming material that includes (a) a water-insoluble, aqueous alkaline solution-soluble polymer compound, (b) a light-heat converting agent and (c) a phenol including a partial structure represented by formula (I) is formed on a substrate, the positive-type image-forming material exhibiting an increase in solubility in an aqueous alkaline solution when the positive-type image-forming material is heated.

Although the functional mechanism of the present invention is not elucidated, the compound represented by formula (I) carries a bulky substituent having a relatively high molecular weight at the o-position, and in such compounds having a bulky substituent at the o-position of the phenolic hydroxyl group, the hydroxyl group is sterically masked. It is therefore presumed that addition of the compound (c) enhances a hydrophobic nature of the phenol compound and allows steric masking of the phenolic hydroxyl group, and when an interaction occurs with the alkali-soluble resin (a) used in combination, the compound (c) also masks a hydroxyl group present in the alkali-soluble resin, whereby alkali permeation is inhibited in an unexposed area and thus scratch resistance of a photosensitive material is improved.

Since the compound (c), although having a bulky group, is a low-molecular compound, inhibition can readily be released through exposure, to allow an increased solubility at a heated portion to thus enhance development latitude. Further, being a low-molecular compound, the compound (c) is considered to be able to exert an improved storability by creating a firm interaction network with the alkali-soluble resin (a), thereby suppressing a change in interaction with the passing of time.

Incidentally, "heat mode-compatible" in the present invention means that recording by heat-mode exposure is possible. The definition of the heat-mode exposure in the present invention is described in detail. As stated in Hans-Joachim Timpe, IS & Ts NIP 15:1999 International Conference on Digital Printing Technologies, p. 209, there are known two modes in a process starting from photo-excitation of a light absorbing material (for example, dyes) effected in a photosensitive material to a chemical or physical change, in the case where photo-excitation is caused in the material resulting in a chemical or physical change to finally form an image. One is a so-called photon mode in which a photo-excited light absorbing material is deactivated by creating some photochemical interaction (for example, energy transfer or electron transfer) with other reactants in a photosensitive material so that the activated reactants induce a chemical or physical change required for the image-forming. Another is a so-called heat mode in which a photo-excited light absorbing material is deactivated by generating heat and, by utilizing the generated heat, reactants induce a chemical or physical change required for the image-forming. There are known additional specific modes, such as abrasion in which a substance is exploded and scattered by an action of energy of light gathered locally or multiphoton absorption in which one molecule absorbs a large number of photons at a time. However, description of these specific modes is omitted herein.

The exposure processes using the foregoing modes are called photon-mode exposure and heat-mode exposure, respectively. A technical difference between the photon-mode exposure and the heat-mode exposure depends on whether or not an energy amount of some photons for exposure can be added to reach an energy amount of an intended reaction. For example, suppose that a reaction is conducted using n photons. Since the photon-mode exposure utilizes a photochemical interaction, accumulative use of energies of individual photons is impossible according to the law of conservation of energy and momentum of quantum. That is, in order to induce any chemical reaction, a relation defined by "energy amount of 1 photon≧energy amount of reaction" is required. Meanwhile, in the heat-mode exposure, heat is generated after photo-excitation, and light energy is converted into heat and then used. Accordingly, accumulation of the energy amounts is possible. Thus, a relation defined by "energy amount of n photons≧energy amount of reaction" is sufficient, with a proviso that there is a limitation to the addition of the energy amount due to the occurrence of heat diffusion. That is, when the subsequent photo-excitation-deactivating process occurs to generate heat before heat is lost from an exposed area (reaction point) through heat diffusion, heat is surely accumulated and added, which leads to an increase in temperature of the affected portion. However, when the subsequent heat generation is delayed, heat is lost, and not accumulated. That is, in heat-mode exposures with the same total exposure energy amount, the results produced are different between the application of light having a large amount of energy for a short period of time and the application of light having a small amount of energy for a long period of time. The application of light for a short period of time is advantageous for accumulation of heat.

Of course, in the photon-mode exposure, a similar phenomenon sometimes occurs due to diffusion of materials effected in the subsequent reaction. However, such a phenomenon basically does not occur.

That is, in view of characteristics of a photosensitive material, in the photon-mode, an inherent sensitivity (energy amount for a reaction required for image-forming) is fixed to a specified value relative to an exposure power density ($w/cm^2$) (=energy density per unit time). However, in the heat-mode, an inherent sensitivity of a photosensitive material is increased relative to an exposure power density. Accordingly, when an exposure time in which a productivity required for an image recording material can actually be maintained is fixed, high sensitization of approximately 0.1 $mJ/cm^2$ can be attained in the photon-mode exposure when comparing the respective modes with one another. However, no matter how small the amount of exposure is, a reaction may occur. Therefore, a problem of fogging is likely to arise due to low exposure in an unexposed area. On the other hand, in the heat-mode exposure, a reaction does not take place unless an exposure amount is more than a specified value. From the relation to heat stability of a photosensitive material, approximately 50 mJ/$cm^2$ is usually required, but a problem of fogging due to low exposure is avoided.

In fact, in the heat-mode exposure, an exposure power density in a plate surface of a photosensitive material has to be 5,000 w/$cm^2$ or more, preferably 10,000 w/$cm^2$ or more. However, it is not preferred to use a high power density laser of more than $5.0\times10^5$ w/$cm^2$ because of a problem that abrasion will occur to taint a light source, which has not been stated in detail herein.

DESCRIPTION OF THE PREFERRED EMBODIMENTS

The present invention is described in detail below.

The positive-type image-forming material of the present invention is characterized by containing the phenol compound having a specific structure. Initially, the phenol compound which serves as a characteristic component in the image-forming material is described.

[(c) A phenol having a partial structure represented by formula (I)]

Specific phenol compounds used in the present invention have a partial structure represented by formula (I) in the molecule.

Formula (I)

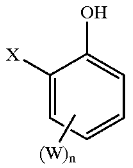

wherein:

X represents a monovalent terminal group having 2 or more carbon atoms or a linking group of —$CY^1Y^2$— or —$CHY^1$— in which $Y^1$ and $Y^2$ each represent a monovalent terminal group having 1 or more carbon atoms;

W represents a monovalent terminal group; and n represents an integer of 1 to 4.

The specific phenol compounds are characterized by carrying a bulky substituent at the opposition. The bulky substituent specifically refers to a substituent having a tertiary or quaternary carbon atom or having 3 or more carbon atoms, with a proviso that a hydroxybenzyl group represented by the following formula is excluded from the bulky substituent in the present invention because it satisfies the foregoing requirements but newly produces a phenolic hydroxyl group which does not exert the effect of masking the hydroxyl group.

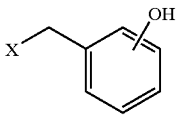

When X represents a monovalent terminal group having 2 or more carbon atoms in formula (I), X is preferably an organic group having 3 to 30 carbon atoms.

Specific examples of such organic groups include a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzlammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include , in addition to the groups listed above, a hydroxyl group, a cyano group, a nitro group, a mercapto group, a halogen atom (e.g., a fluorine atom, a chlorine atom, a bromine atom, etc).

Preferable examples of specific phenol compounds as the component (c) used in the present invention include phenol compounds represented by formulas (II), (III) and (IV) below.

Formula (II)

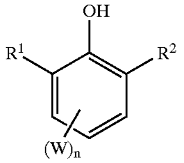

Formula (III)

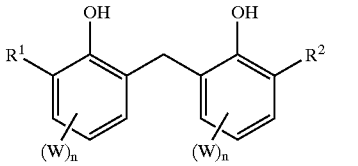

Formula (IV)

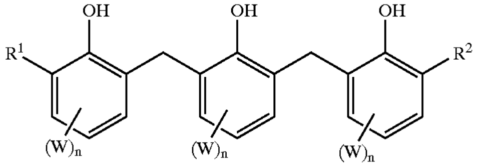

In the compounds represented by formulas (II) to (IV) above, $R^1$ and $R^2$, which may be the same or different, each represent a hydrogen atom or a monovalent organic group, and at least one of $R^1$ and $R^2$ represents a monovalent organic group having 3 or more carbon atoms.

Examples of such $R^1$ and $R^2$ include a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkynyl group (e.g., ethynyl, 1-propinyl, etc), an aryl group (e.g., phenyl, naphtyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecansulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

Preferably illustrative examples of the combination of $R^1$ and $R^2$ in the compounds represented by formulas (II) to (IV) include, but are not limited to, those shown in Tables 1 and 2 below.

TABLE 1

| | $R^1$ | $R^2$ |
|---|---|---|
| B-1 | —Pr(i) | —Pr(i) |
| B-2 | —Bu(t) | —Bu(t) |
| B-3 | -Hex(cyclo) | -Hex(cyclo) |
| B-4 | —O-TBS*1 | —O-TBS*1 |
| B-5 | —O—Bu(t) | —O—Bu(t) |
| B-6 | -TMS*2 | —H |
| B-7 | $—COC_6H_{13}$ | $—COC_6H_{13}$ |
| B-8 | 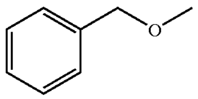 | —H |
| B-9 | -Vinyl | -Vinyl |
| B-10 | -allyl | -allyl |
| B-11 | -Hex(cyclo) | -Hex(cyclo) |
| B-12 | $—CO_2Et$ | $—CO_2Et$ |
| B-13 | $—NHCOC_8H_{17}$ | $—NHCOC_8H_{17}$ |
| B-14 | $—N(C_3H_7)_2$ | $—N(C_3H_7)_2$ |
| B-15 | $—SC_8H_{17}$ | $—SC_8H_{17}$ |
| B-16 | $—C_8F_{17}$ | —H |
| B-17 | —OH | —Et |
| B-18 | —H | —O—Bu(t) |
| B-19 | $—OC_8H_{17}$ | $—OC_8H_{17}$ |
| B-20 | $—CHMe_2$ | —H |
| B-21 | 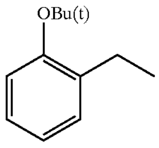 | 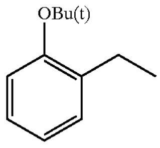 |

TABLE 1-continued
| | $R^1$ | $R^2$ |
|---|---|---|
| B-22 | 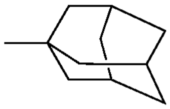 | 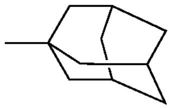 |
| B-23 | $—C_8F_{17}$ | $—C_8F_{17}$ |
TABLE 2
| | $R^1$ | $R^2$ |
|---|---|---|
| B-24 | 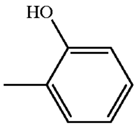 | —H |
| B-25 | —O-Ts*[3] | —O-Ts*[3] |
| B-26 | —$OCO_2$—Bu(t) | —$OCO_2$—Bu(t) |
| B-27 | 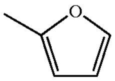 | 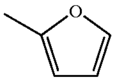 |
| B-28 | 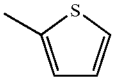 | 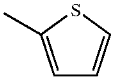 |
| B-29 | 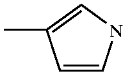 | 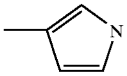 |
| B-30 | 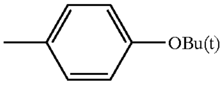 | 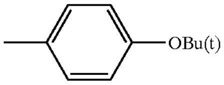 |
| B-31 | 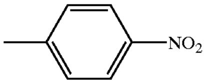 | 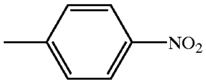 |
| B-32 | 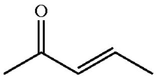 | 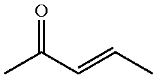 |
| B-33 | 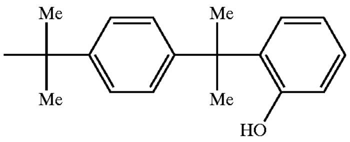 | —H |
| B-34 | 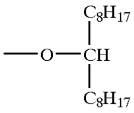 | 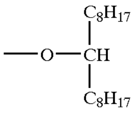 |
| B-35 | 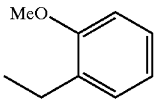 | —H |

TABLE 2-continued

| | $R^1$ | $R^2$ |
|---|---|---|
| B-36 | 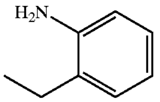 | —H |
| B-37 | 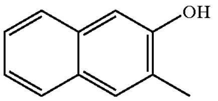 | —H |

In Tables 1 and 2, *1:—TBS denotes a tert-butyldimethylsilyl group, *2:—TMS denotes a trimethylsilyl group and *3:—Ts denotes a tosyl group, respectively, as represented by the following structures.

*1 tert-butyldimethylsilyl

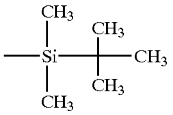

*2 trimethylsilyl

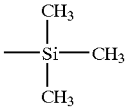

*3 tosyl

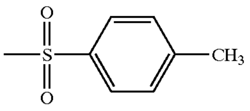

Further, in the formula (I) shown above, when X represents a monovalent terminal group having 2 or more carbon atoms, preferable are the specific phenol compounds including a partial structure represented by the following formula (XII):

Formula (XII)

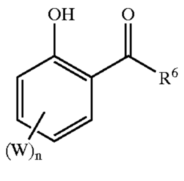

Wherein:

$R^6$ represents a monovalent organic group having 2 or more carbon atoms;

W represents a monovalent terminal group; and n represents an integer of 1 to 4, with a proviso that if n is 2 or more, the groups represented by W may be the same or different and may be connected to each other via a linking group.

In formula (XII), examples of $R^6$ include a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

Preferable examples of $R^6$ in formula (XII) include, but are not limited to, those shown in Table (A) below.

TABLE (A)

| | $R^6$ |
|---|---|
| F-1 | $—C_2H_5$ |
| F-2 | 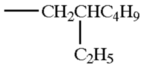 |
| F-3 | 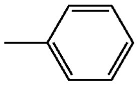 |
| F-4 | 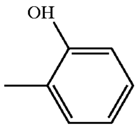 |
| F-5 | 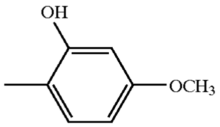 |
| F-6 | 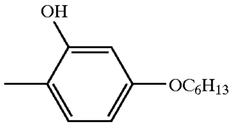 |
| F-7 | 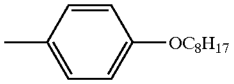 |
| F-8 | 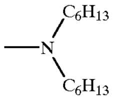 |
| F-9 | $—OC_6H_{13}$ |
| F-10 | 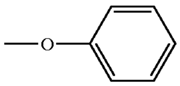 |
| F-11 | 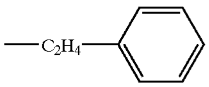 |
| F-12 | 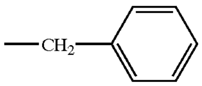 |

TABLE (A)-continued

| | $R^6$ |
|---|---|
| F-13 | 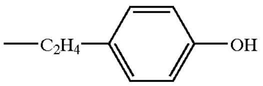 |
| F-14 | 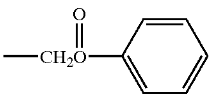 |
| F-15 | 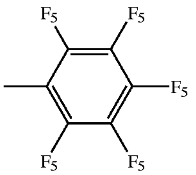 |
| F-16 | 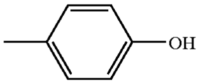 |
| F-17 | 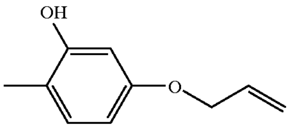 |
| F-18 | 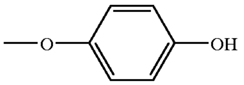 |
| F-19 | 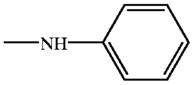 |
| F-20 | 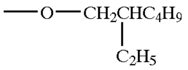 |
| F-21 | $—OC_{12}H_{25}$ |
| F-22 | 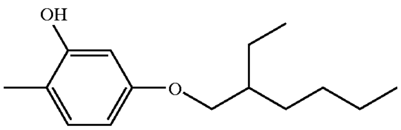 |
| F-23 | 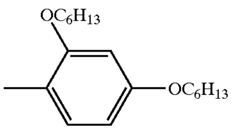 |
| F-24 | 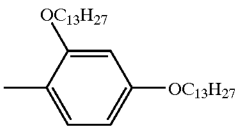 |

TABLE (A)-continued

| | $R^6$ |
|---|---|
| F-25 | 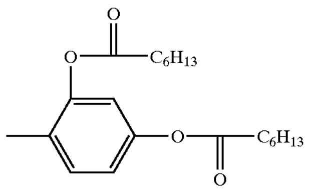 |
| F-26 | $—NHC_8H_{17}$ |
| F-27 | $—OC_6F_{13}$ |
| F-28 | 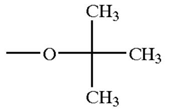 |
| F-29 | 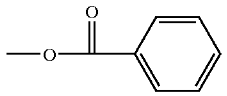 |
| F-30 | $—C_6H_{12}OH$ |
| F-31 | 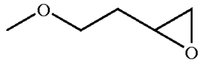 |
| F-32 | $—C_6H_{12}Br$ |
| F-33 | 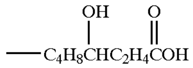 |
| F-34 | $—NHC_2H_4Br$ |
| F-35 | 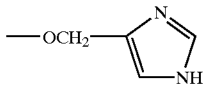 |
| F-36 | 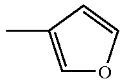 |
| F-37 | $—C_2H_4CN$ |
| F-38 | 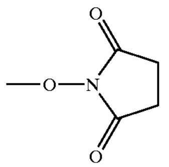 |

Furthermore, the formula (XII) shown above preferably has the structure represented by the following formula (XIII) or (XIV):

Formula (XIII)

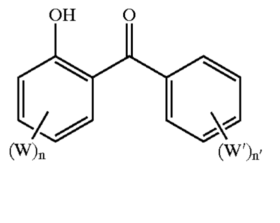

wherein:

W and W' each represent monovalent terminal groups; and n represents an integer of 1 to 4, and n' represents an integer of 1 to 5, with a proviso that if n and n' are both 2 or more, then the groups represented by W may be the same or different and may be connected to each other via a linking group and the groups represented by W' may be the same or different and may be connected to each other via a linking group.

Formula (XIV)

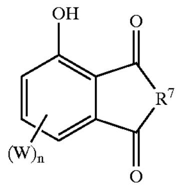

wherein:

$R^7$ represents an alkyl group having 1 to 20 carbon atoms;

$R^8$ represents a divalent linking group;

W represents a monovalent terminal group; and W' represents a monovalent terminal group other than a hydroxyl group; and n represents an integer of 1 to 4, with a proviso that if n is 2 or more, the groups represented by W may be the same or different and may be connected to each other via a linking group.

In the formula (XIV) above, examples of $R^7$ include a straight- or branched-chain alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

Preferable examples of $R^7$ in the phenol compounds having a partial structure represented by formula (XIV) include, but are not limited to, those shown in Table (B) below.

TABLE B

| | $R^7$ |
|---|---|
| E-1 | 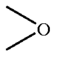 |
| E-2 | 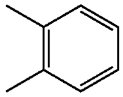 |
| E-3 | 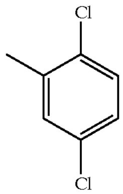 |
| E-4 | 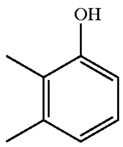 |
| E-5 | 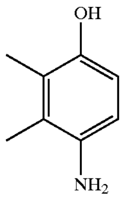 |

TABLE B-continued

| | $R^7$ |
|---|---|
| E-6 | 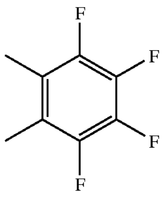 |
| E-7 | 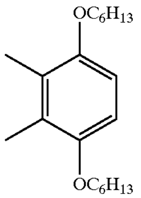 |
| E-8 | 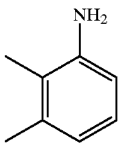 |

In formula (I) above, when X represents a linking group of —$CY^1Y^2$— or —$CHY^1$— in which $Y^1$ and $Y^2$ each represent a monovalent organic group having 1 or more carbon atoms, the monovalent organic group is preferably an organic group having 1 to 15 carbon atoms.

In this case, preferable examples of the organic groups include a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide,N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy3, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

Preferable examples of the partial structure represented by formula (I) in which X represents a linking group of $—CY^1Y^2—$ or $—CHY^1—$ in the present invention include those represented by formulas (V) and (VI).

Formula (V)

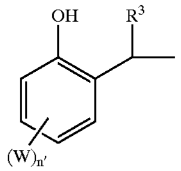

Formula (VI)

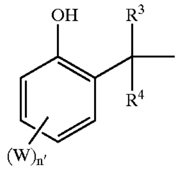

In formulas (V) and (VI), n' represents an integer of 1 to 4. $R^3$ and $R^4$ each independently represent a hydrogen atom, a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

In formulas (V) and (VI) shown above, it is made a proviso that $R^3$ and $R^4$ are not both a hydrogen atom.

Preferable examples of the specific phenol compounds having such a partial structure include phenol compounds represented by formulas (VII) and (VIII) below.

Formula (VII)

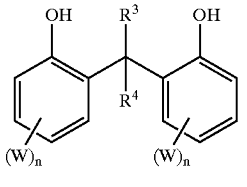

-continued

Formula (VIII)

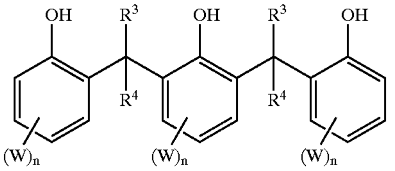

Preferably illustrative combination of $R^3$ and $R^4$ in the phenol compounds represented by formulas (VII) and (VIII) include, but are not limited to, those shown in Table 3 below.

TABLE 3

| | $R^3$ | $R^4$ |
|---|---|---|
| C-1 | —Me | —Me |
| C-2 | —Ph | —H |
| C-3 | -Hex(cyclo) | —H |
| C-4 | $—C_6F_5$ | —H |
| C-5 | —O—Bu(t) | —O—Bu(t) |
| C-6 | -TMS*2 | —H |
| C-7 | $—COC_6H_{13}$ | —H |
| C-8 | 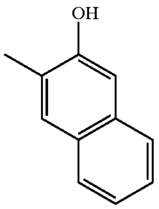 | —H |
| C-9 | $—CF_3$ | $—CF_3$ |
| C-10 | —OH | —Me |
| C-11 | —OH | —OEt |
| C-12 | $—CHMe_2$ | —H |
| C-13 | 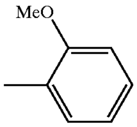 | —H |
| C-14 | —H | —O—Bu(t) |
| C-15 | —O-Ts*3 | —H |
| C-16 | $—OCO_2—Bu(t)$ | —H |
| C-17 | 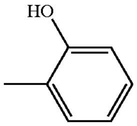 | —H |

In formula (I), when X represents a linking group of $—CY^1Y^2—$ in which $Y^1$ and $Y^2$ are connected via a linking group, it is preferable that $Y^1$ and $Y^2$ are composed of an organic group having 2 or more carbon atoms.

Examples of the organic groups having 2 or more carbon atoms include a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

In this case, phenols having a partial structure represented by formula (IX) below as a preferable partial structure are mentioned.

Formula (IX)

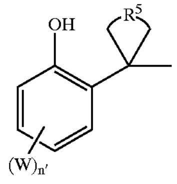

In formula (IX), n' represents an integer of 1 to 4. Examples of the specific phenol compounds having such a partial structure include phenols represented by formula (X) or (XI) below.

Formula (X)

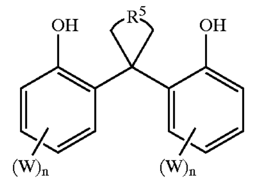

Formula (XI)

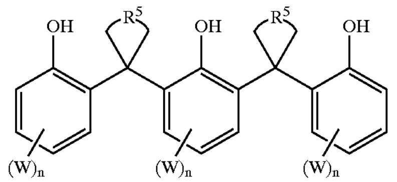

In formulas (X) and (XI), $R^5$ represents a straight- or branched-chain alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio, naphthylth, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc). Specific examples thereof include cycloalkyl, lactone, lactam, lactol, cyclic acid anhydride, cyclic acetal, cyclic ether, cyclic thioether, cyclic sulfonic acid and spiropyran.

These organic groups may further have substituents. Examples of the substituents to be introduced include a straight- or branched-chain alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e.g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g., phenoxycarbonylamino, naphthoxycarbonylamino, etc), an amino group (e.g., amino, methylamino, diethylamino, diisopropylamino, anilino, morpholino, etc), an ammonio group (e.g., trimethylammonio, dimethylbenzylammonio, etc), a carboxyl group, a sulfo group, an alkylsulfinyl group (e.g., methanesulfinyl, octanesulfinyl, etc), an arylsulfinyl group (e.g., benzenesulfinyl, 4-chlorophenyls, p-toluenesulfinyl, etc), an alkylthio group (e.g., methylthio, octylthio, cyclohexylthio, etc), an arylthio group (e.g., phenylthio, naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group. The groups listed above may further have substituents, and examples of such substituents include, in addition to the groups listed above, a hydroxyl group, a cyano group, a nitro group, a mercapto group, a halogen atom (e.g., a fluorine atom, a chlorine atom, a bromine atom, etc).

Further, $R^5$ preferably represents a divalent organic group having 3 or more carbon atoms, and more preferably a divalent organic group having 3 to 6 carbon atoms.

Preferable examples of $R^5$ in the phenol compounds represented by formulas (X) and (XI) include, but are not limited to, those shown in Table 4 below.

TABLE 4

| | $R^5$ | | $R^5$ |
|---|---|---|---|
| A-1 | 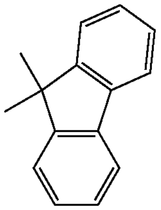 | A-10 | 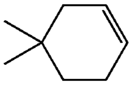 |
| A-2 | 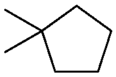 | A-11 | 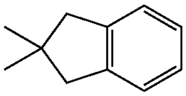 |
| A-3 | 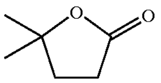 | A-12 | 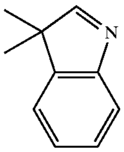 |
| A-4 | 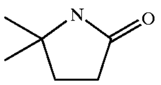 | A-13 | 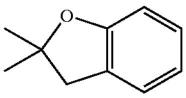 |
| A-5 | 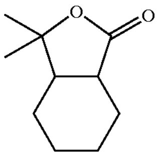 | A-14 | 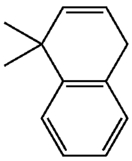 |
| A-6 | 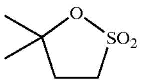 | A-15 | 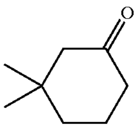 |

TABLE 4-continued

| | $R^5$ | | $R^5$ |
|---|---|---|---|
| A-7 | 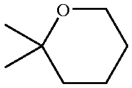 | A-16 | 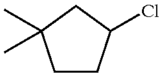 |
| A-8 | 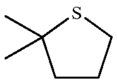 | A-17 | 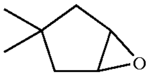 |
| A-9 | 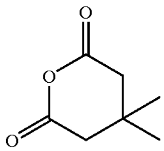 | A-18 | 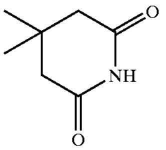 |

In each of the foregoing formulas, examples of Ws and W's as the monovalent terminal group include a hydrogen atom, a straight- or branched-chain or cyclic alkyl group (e.g., methyl, ethyl, propyl, heptafluoropropyl, isopropyl, butyl, t-butyl, t-pentyl, cyclopentyl, cyclohexyl, octyl, 2-ethylhexyl, dodecyl, etc), a straight- or branched-chain or cyclic alkenyl group (e.g., vinyl, 1-methylvinyl, cyclohexene-1-yl, etc), an alkynyl group (e.g., ethynyl, 1-propinyl, etc), an aryl group (e.g., phenyl, naphthyl, anthryl, etc), an acyloxy group (e.g., acetoxy, tetradecanoyloxy, benzoyloxy, etc), an alkoxycarbonyloxy group (e.g., methoxycarbonyloxy, 2-methoxyethoxycarbonyloxy, etc), an aryloxycarbonyloxy group (e.g., phenoxycarbonyloxy, etc), a carbamoyloxy group (e.g., N,N-dimethylcarbamoyloxy, etc), a carbonamide group (e.g., formamide, N-methylacetamide, acetamide, N-methylformamide, benzamide, etc), a sulfonamide group (e.g., methanesulfonamide, dodecanesulfonamide, benzenesulfonamide, p-toluenesulfonamide, etc), a carbamoyl group (e.g., N-methylcarbamoyl, N,N-diethylcarbamoyl, N-mesylcarbamoyl, etc), a sulfamoyl group (e.g., N-butylsulfamoyl, N,N-diethylsulfamoyl, N-methyl-N-(4-methoxyphenyl)sulfamoyl, etc), an alkoxy group (e.g., methoxy, propoxy, isopropoxy, octyloxy, t-octyloxy, dodecyloxy, 2-(2,4-di-t-pentylphenoxy)ethoxy, polyalkyleneoxy, etc), an aryloxy group (e g., phenoxy, 4-methoxyphenoxy, naphthoxy, etc), an aryloxycarbonyl group (e.g., phenoxycarbonyl, naphthoxycarbonyl, etc), an alkoxycarbonyl group (e.g., methoxycarbonyl, t-butoxycarbonyl, etc), an N-acylsulfamoyl group (e.g., N-tetradecanoylsulfamoyl, N-benzoylsulfamoyl, etc), an N-sulfamoylcarbamoyl group (e.g., N-methanesulfonylcarbamoyl, etc), an alkylsulfonyl group (e.g., methanesulfonyl, octylsulfonyl, 2-methoxyethylsulfonyl, 2-hexyldecylsulfonyl, etc), an arylsulfonyl group (e.g., benzenesulfonyl, p-toluenesulfonyl, 4-phenylsulfonyl, etc), an alkoxycarbonylamino group (e.g., ethoxycarbonylamino, etc), an aryloxycarbonylamino group (e.g. phenoxycarbonylamino, naphthoxycarbonylamino, etc), an amino group (e.g. amino, methylamino, diethylamino, diisopropylamino, anilino, morpholino, etc), an ammonio group (e.g., trimethylammonio, dimethylbenzylammonio, etc), a cyano group nitro group, a carboxyl group, a hydroxy group, a sulfo group, a mercapto group, an alkylsulfinyl group (e.g., methanesulfinyl, octanesulfinyl, etc), an arylsulfinyl group (e.g., benzenesulfinyl, 4-chlorophenylsulfinyl, p-toluenesulfinyl, etc), an alkylthio group (e.g., methylthio, octylthio, cyclohexylthio, etc), an arylthio group (e.g., phenylthio naphthylthio, etc), an ureido group (e.g., 3-methylureido, 3,3-dimethylureido, 1,3-diphenylureido, etc), a heterocyclic group (e.g., a 3 to 12 membered monocyclic or condensed ring containing at least one atom as a heteroatom such as nitrogen, oxygen, sulfur or the like, such as 2-furyl, 2-pyranyl, 2-pyridyl, 2-thienyl, 2-imidazolyl, morpholino, 2-quinolyl, 2-benzimidazolyl, 2-benzothiazolyl, 2-benzoxazolyl, etc), an acyl group (e.g., acetyl, benzoyl, trifluoroacetyl, etc), a sulfamoylamino group (e.g., N-butylsulfamoylamino, N-phenylsulfamoylamino, etc), a silyl group (e.g., trimethylsilyl, dimethyl-t-butylsilyl, triphenylsilyl, etc), an azo group, a halogen atom (e.g., a fluorine atom, a chlorine atom, a bromine atom, etc). The groups listed above may further have substituents, and examples of such substituents include the groups listed above.

When n is 2 or more, Ws may be the same or different or may be connected to each other via a linking group, and W's may be the same or different or may be connected to each other via a linking group.

Specific examples of W and W' in each of the foregoing formulas include the following, but are not limited thereto.

—H —Cl —Br —F —I —Me —Et

—Pr(i) —Bu(t) 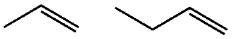 —$C_2Cl_5$

—$C_2F_5$ —$C_8F_{17}$ —SH —OH 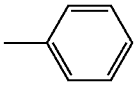

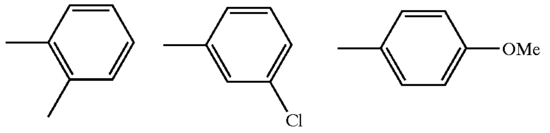

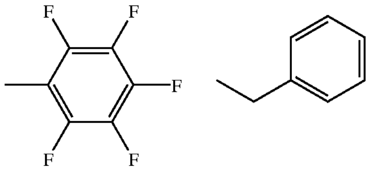 —OBu(t)

—$OC_3H_7$ 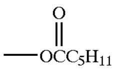 —$SC_6H_{13}$ —$NEt_2$

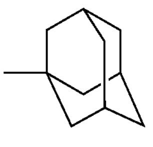 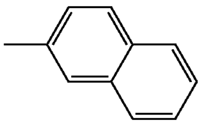 —NHCO—$C_4H_9$

—$NO_2$ —$CO_2H$ —$SO_3H$ 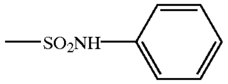

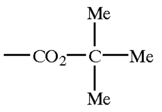 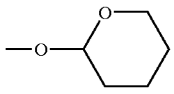 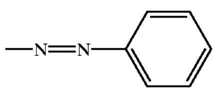

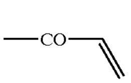 —CN 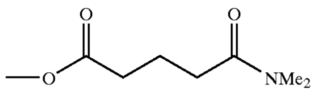

-continued

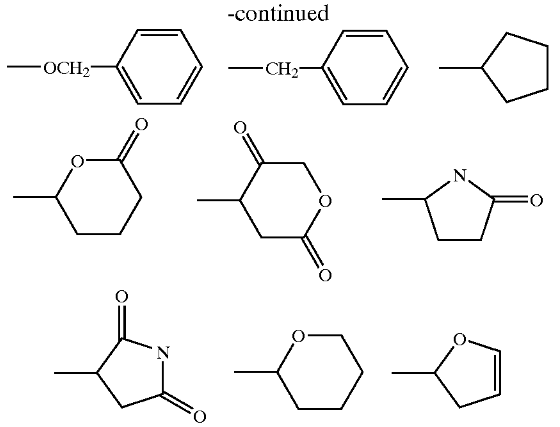

—O—TBS*1 —O—TBS*2 —O—Ts*3 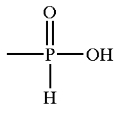

When W's are connected to each other:

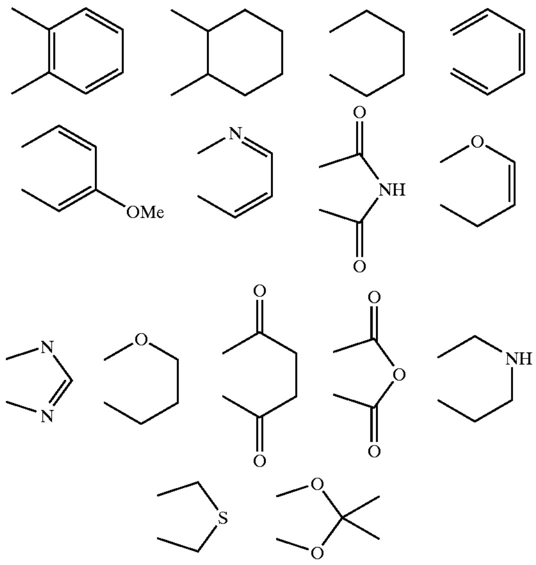

With respect to the phenol compound (c) having the partial structure represented by formula (I) used in the present invention, among the preferable compounds represented by formulas (II) to (XI), the compounds represented by formulas (VII), (VIII), (X) and (XI) are more preferable in view of improvement of the hydrophobic nature of the phenolic hydroxyl group. Most preferable are the compounds represented by formulas (VII) and (X).

The molecular weight of the phenol compound (c) having the partial structure represented by formula (I) used in the present invention is preferably 1,500 or less, more preferably 200 to 1,200. When the molecular weight is too high, it is hard to create close interaction with the alkali-soluble resin (a), and stability with the passing of time might be decreased.

Specific examples of compounds that can suitably be used as the specific phenol compound (c) having a bulky substituent at the o-position in the present invention are described below, but are not limited thereto.

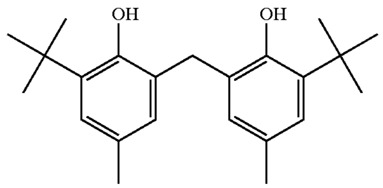
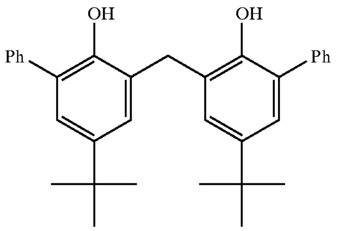
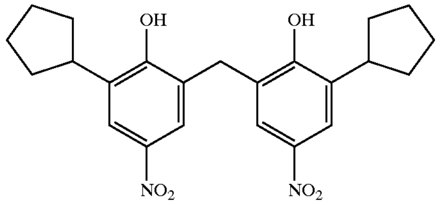
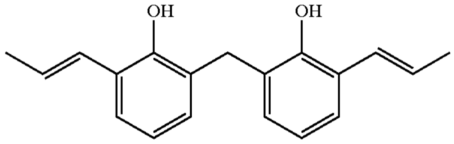
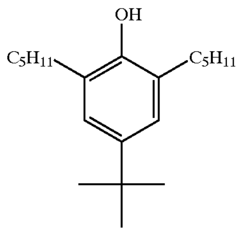
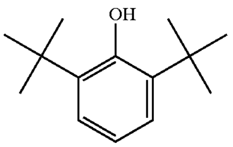
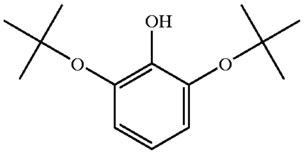
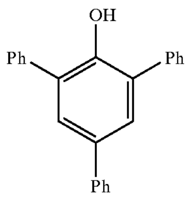
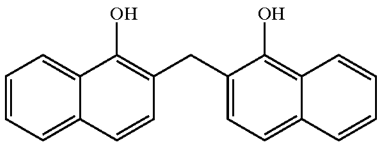
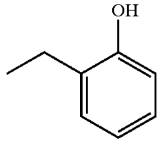
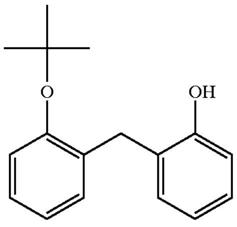
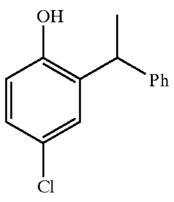
-continued
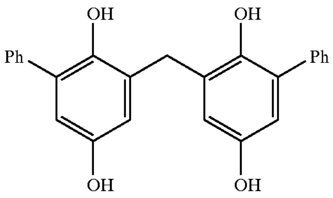
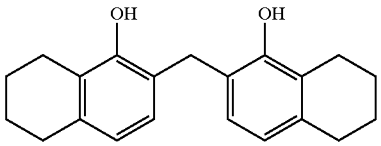
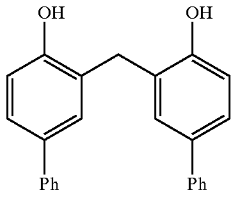
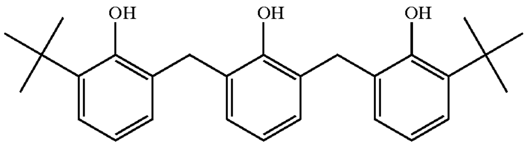
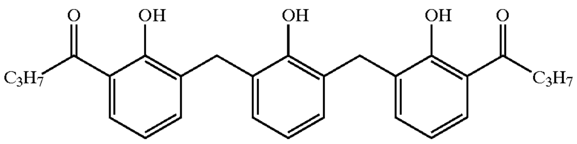
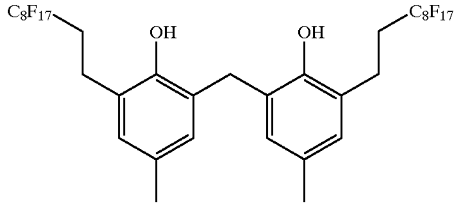
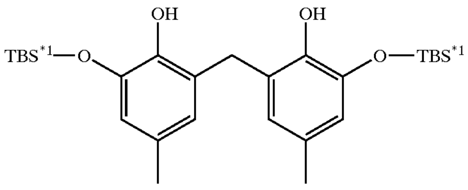
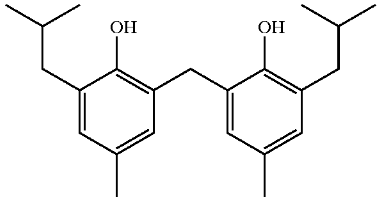
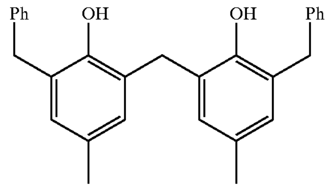

-continued
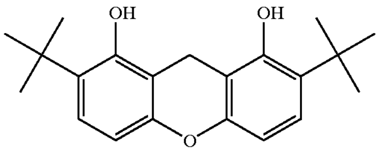
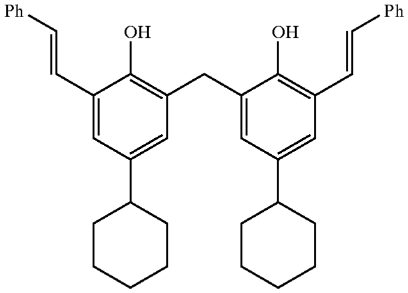
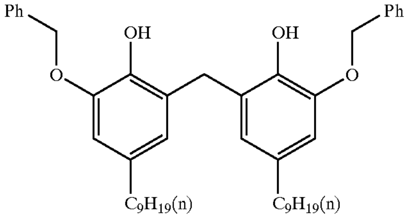
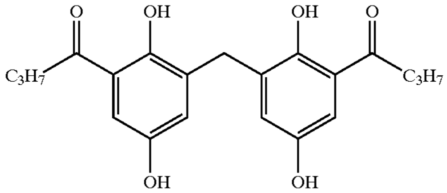
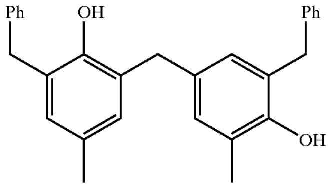
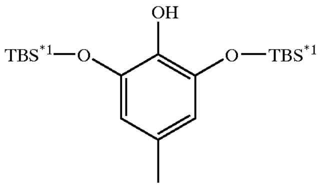
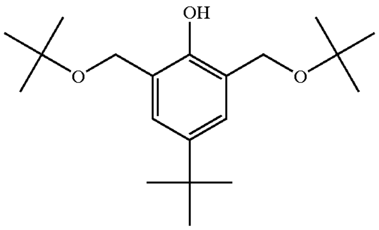
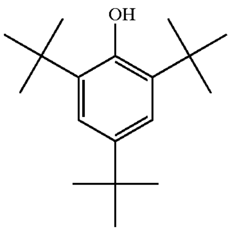
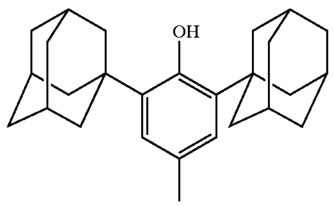
-continued
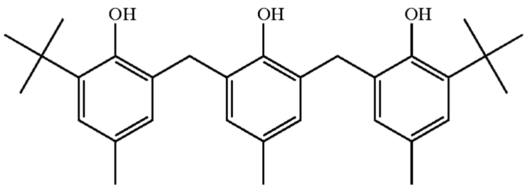
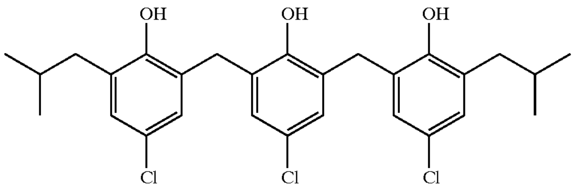
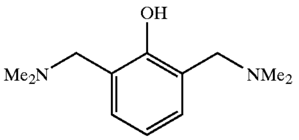
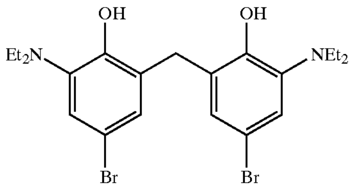
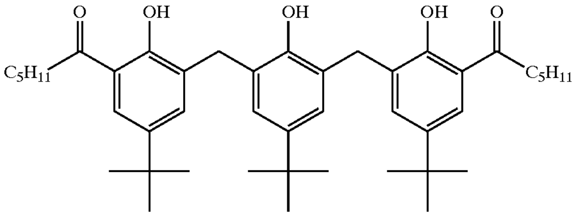
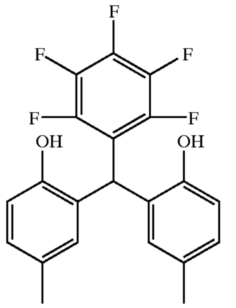
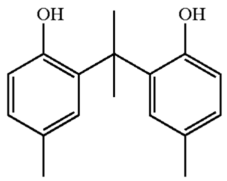
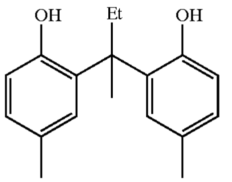
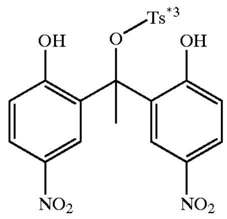
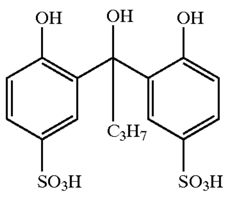

-continued
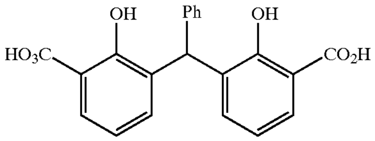
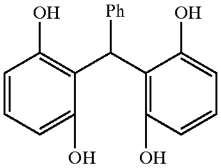
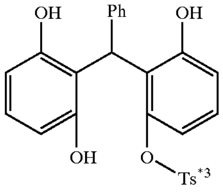
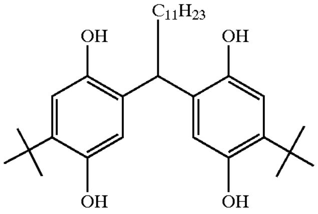
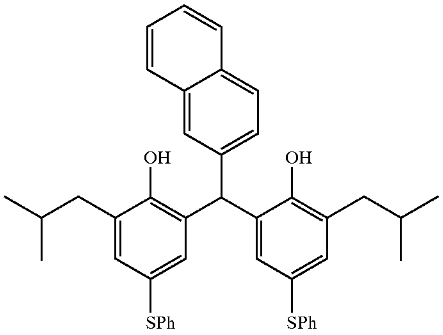
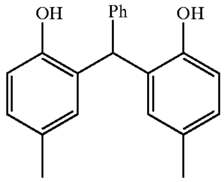
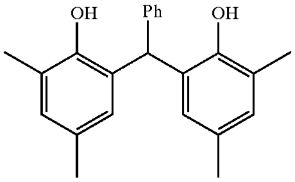
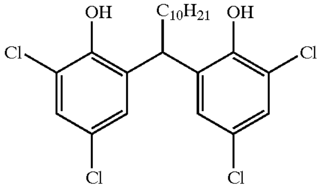
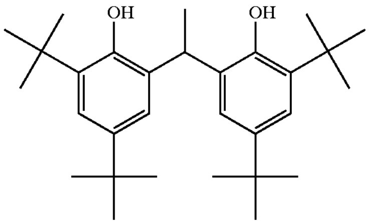
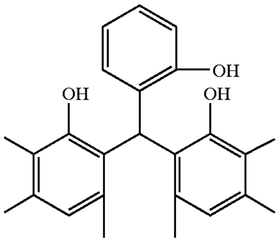
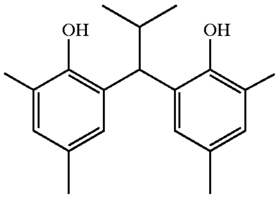
-continued
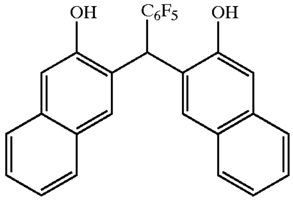
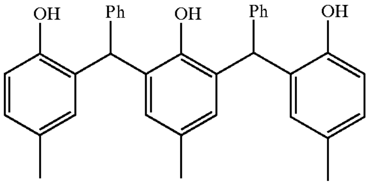
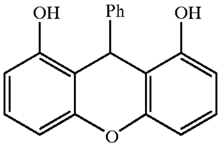
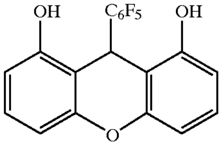
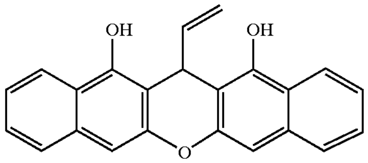
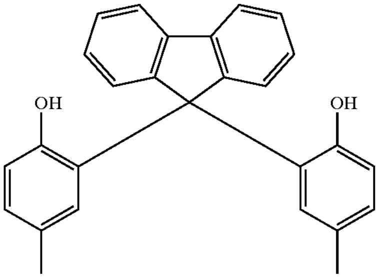
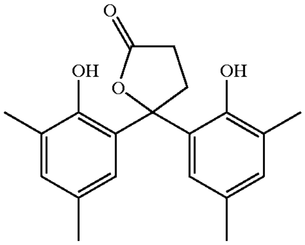
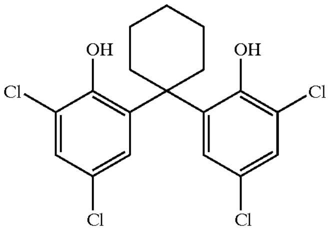
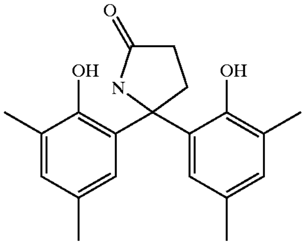

-continued
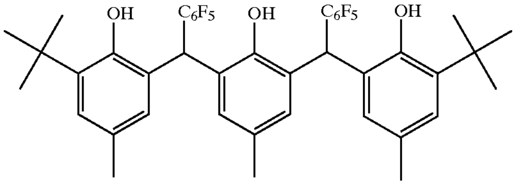
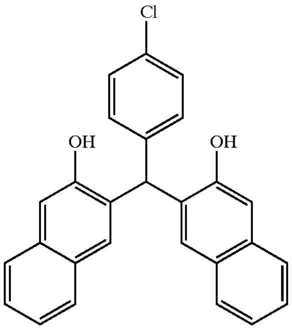
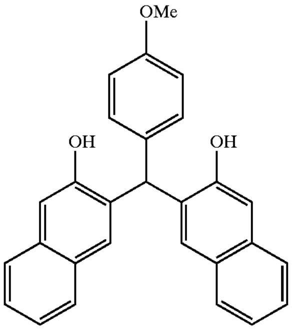
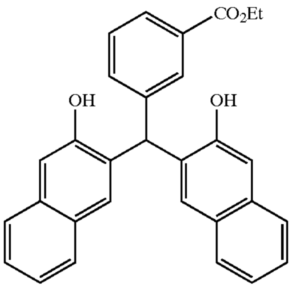
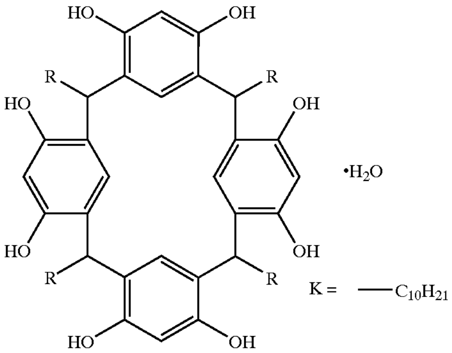
-continued
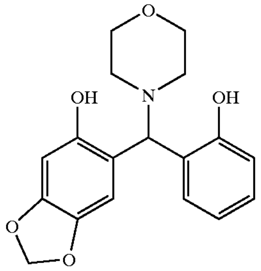
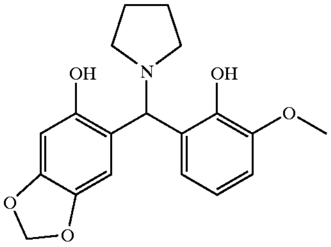
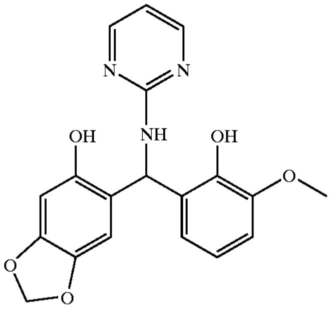
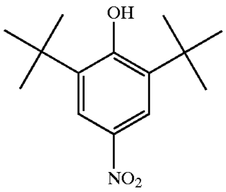
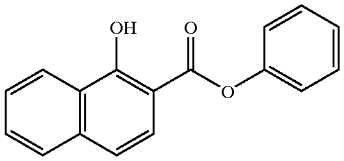
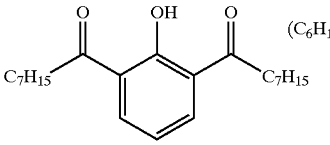
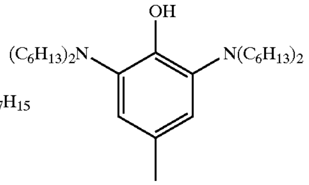
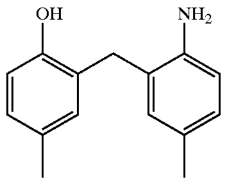
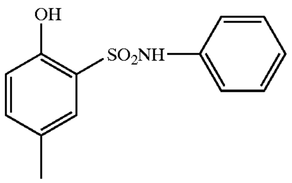
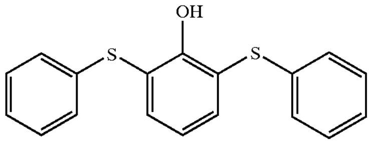
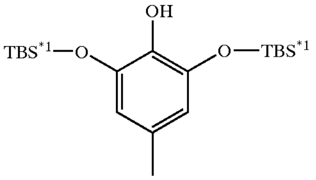

-continued
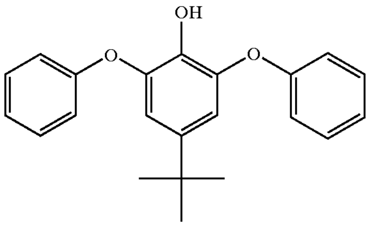
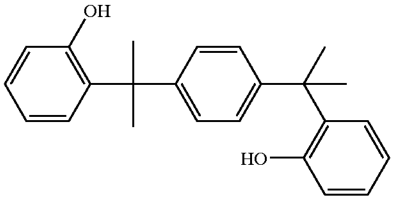
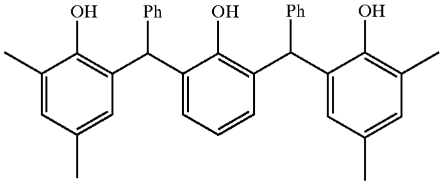
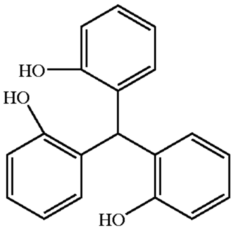
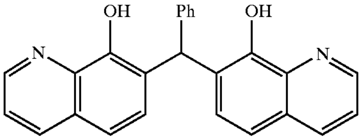
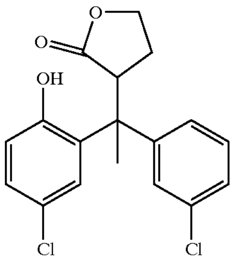
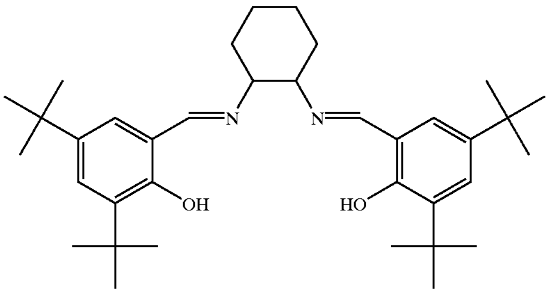
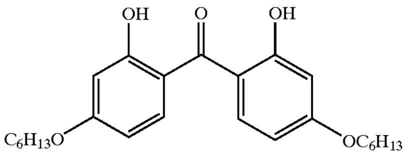
-continued
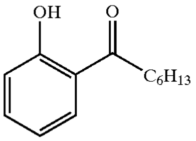
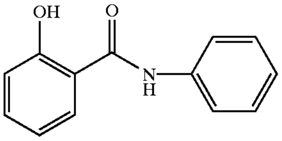
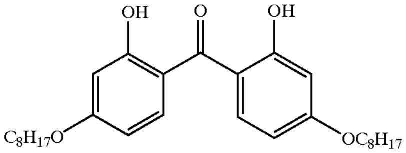
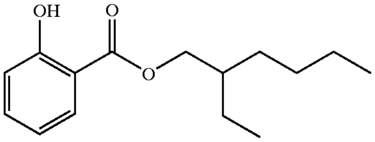
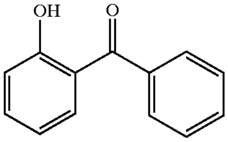
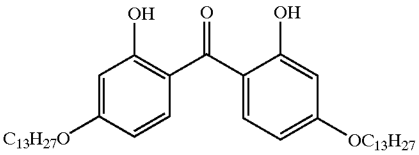
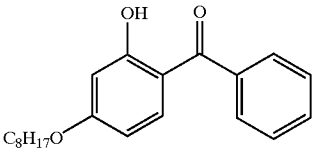
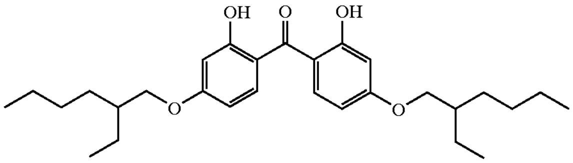
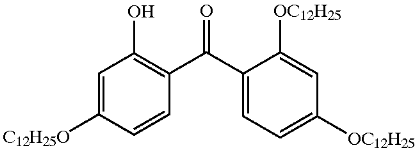
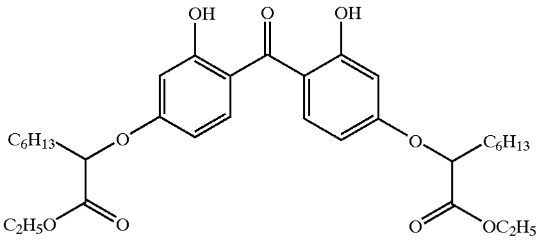
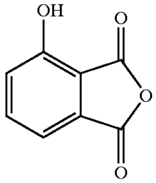
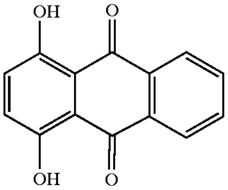

-continued

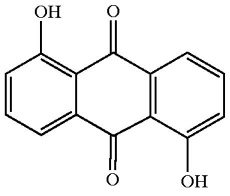

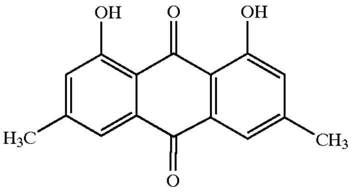

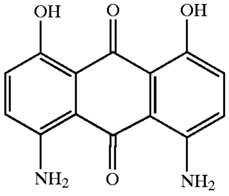

The specific phenol compound (c) used in the present invention can easily be formed using a typical phenol compound as the starting material employing a known method described in, for example, "*Jikken Kagaku Koza* 28" ("Experimental Chemistry Lectures 28"), 4th ed. (edited by The Chemical Society of Japan, published by Maruzen), pp. 427–430 or "Phenolic Resins" (written by Andre Knop and Lois A. Pilato, published by Plastic Age), pp. 18–90. Synthesis examples of typical compounds are described below.

SYNTHESIS EXAMPLE 1

Synthesis of a Specific Phenol Compound (D-1)

A mixture of 44.0 g of p-cresol, 20.0 g of pentafluorobenzaldehyde and 0.5 g of p-toluenesulfonic acid monohydrate was heated to 140° C., followed by stirring for 4 hours. After the reaction, volatile components were evaporated off under reduced pressure. The residue was dissolved in 100 ml of methanol, and then poured into 2,000 ml of water. The separated product was collected by filtration, washed with water, and dried to obtain 32.2 g of a specific phenol compound (D-1) of the following structure having a bulky functional group at the o-position.

SYNTHESIS EXAMPLE 2

Synthesis of a Specific Phenol Compound (D-2)

A mixture of 23.2 g of 2,4-xylenol, 10.7 g of cyclohexylcarboxylic acid, 100.0 g of methanol and 0.5 g of p-toluenesulfonic acid monohydrate was heated to 140° C., followed by stirring for 4 hours. After the reaction, a crystalline component was collected by filtration, washed with methanol, and dried to give 11.4 g of a specific phenol compound (D-2) of the following structure having a bulky functional group at the o-position.

SYNTHESIS EXAMPLE 3

Synthesis of a Specific Phenol Compound (D-3)

A mixture of 25.5 g of 4-(1-adamantyl)phenol, 100 ml of methanol, 10.1 g of pentafluorobenzaldehyde and 232 mg of tosyl acid monohydrate was heated under reflux for 5 hours. After the reaction, volatile components were evaporated off under reduced pressure. The residue was dissolved in 200 ml of methanol, and then poured into 3,000 ml of water. The separated product was collected by filtration, washed with water, and dried to produce 15.2 g of a specific phenol compound (D-3) of the following structure having a bulky functional group at the o-position.

SYNTHESIS EXAMPLE 4

Synthesis of a Specific Phenol Compound (D-4)

One mol of dimethylamine (35% aqueous solution) was added to 50 g of methylenebis(4-methyl)phenol, followed by addition of 1 mol of formalin dropwise at room temperature. After the reaction, an organic layer was extracted with ethyl acetate, evaporated off under reduced pressure, and then solidified. The resulting product was recrystallized using methanol to yield 42.0 g of a specific phenol compound (D-4) of the following structure having a bulky functional group at the o-position.

SYNTHESIS EXAMPLE 5

Synthesis of a Specific Phenol Compound (D-5)

A mixture of 50 g of 2,2'-methylenebis(4-methyl)phenol, 50.0 g of isopropyl alcohol and 2.0 g of sulfuric acid was heated to 75° C., followed by stirring for 8 hours. After the reaction, volatile components were evaporated off under reduced pressure. The residue was dissolved in 250 ml of methanol, and then poured into 4,000 ml of water. The separated product was collected by filtration, washed with water, and dried to afford 39.0 g of a specific phenol compound (D-5) of the following structure having a bulky functional group at the o-position.

SYNTHESIS EXAMPLE 6

Synthesis of a Specific Phenol Compound (D-6)

Forty grams of isobutylene was added to a mixture of 50 g of methylenetris(4-chloro)phenol, 100.0 g of benzene and 2.0 g of sulfuric acid, and the solution was heated to 50° C., followed by stirring for 7 hours. After the reaction, volatile components were evaporated off under reduced pressure. The residue was dissolved in 250 ml of methanol, and then poured into 4,000 ml of water. The separated product was collected by filtration, washed with water, and dried to obtain 62.5 g of a specific phenol compound (D-6) of the following structure having a bulky functional group at the o-position.

SYNTHESIS EXAMPLE 7

Synthesis of a Specific Phenol Compound (D-7)

One hundred grams of tert-butyldimethylsilyl chloride (TBSCl) was added to a mixture of 50 g of 2,4-dimethylolphenol, 100.0 g of toluene and 44.1 g of imidazole, followed by stirring at room temperature for 5 hours. After the reaction, volatile components were evaporated off under reduced pressure. The separated product was recrystallized, and dried to give 110.2 g of a specific phenol compound (D-7) of the following structure having a bulky functional group at the o-position.

SYNTHESIS EXAMPLE 8

Synthesis of a Specific Phenol Compound (D-8)

A mixture of 50.0 g of 2,4-xylenol, 21.0 g of succinic acid anhydride, 100.0 g of methanol and 2.0 g of p-toluenesulfonic acid monohydrate was heated to 140° C., followed by stirring for 4 hours. After the reaction, a crystalline component was collected by filtration, washed with methanol, and dried to produce 62.0 g of a specific phenol compound (D-8) of the following structure having a bulky functional group at the o-position.

SYNTHESIS EXAMPLE 9

Synthesis of a Specific Phenol Compound (D-9)

Hexyl p-toluenesulfonate (92.0 g) was added to a mixture of 40.0 g of 2,2',4,4'-tetrahydroxybenzophenone, 54.0 g of potassium carbonate and 250.0 g of 2-butanone, followed by heating to 95° C. and subsequent stirring for 5 hours. After the reaction, the reaction mixture was neutralized with a dilute hydrochloric acid, and 500 ml of methanol was added. A crystalline component was collected by filtration, and recrystallized using acetonitrile to yield 15.0 g of a specific phenol compound (D-9) of the following structure having a bulky functional group at the o-position.

SYNTHESIS EXAMPLE 10

Synthesis of a Specific Phenol Compound (D-10)

A mixture of 30.0 g of tetrahydroxybenzophenone, 90 ml of MFG, 37.5 g of sodium hydrogencarbonate, 88.0 g of 1-bromo-undecan and 979 mg of potassium iodide was heated at 130° C. for 8 hours. After reaction was completed, the mixture was cooled to room temperature and neutralized by adding dilute hydrochloric acid. A segregated product was filtered, washed with 120 ml of ethylacetate and 150 ml of acetonitrile, and dried to obtain 32.1 g of a specific phenol compound (D-10) of the following structure.

D-1

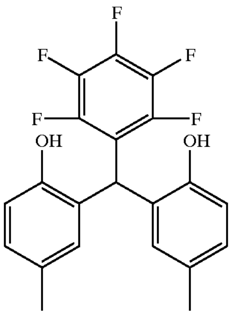

D-2

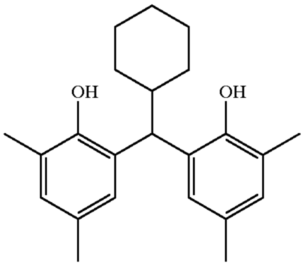

-continued

D-3

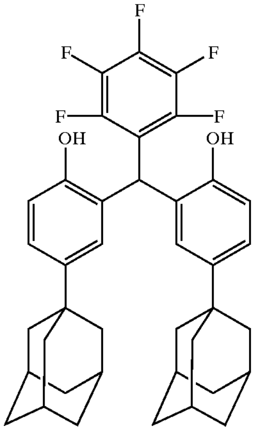

D-4

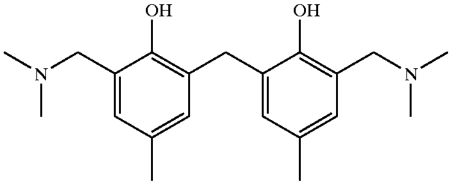

D-5

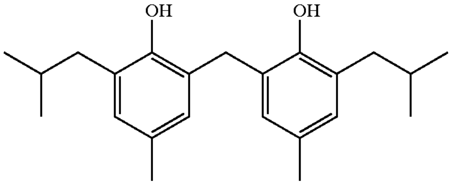

D-6

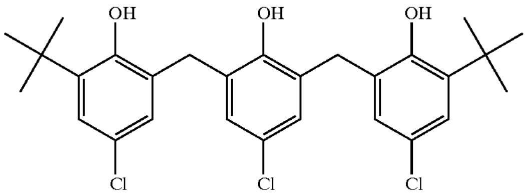

D-7

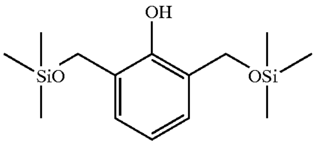

D-8

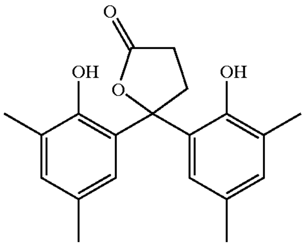

D-9

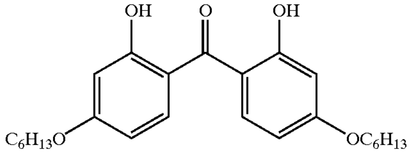

-continued

D-10

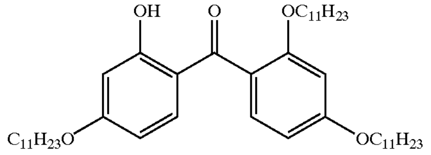

Furthermore, commercially available compounds are also usable as a phenol compound (C) for use in the present invention. Examples of such commercially available compounds are shown below.

D-11

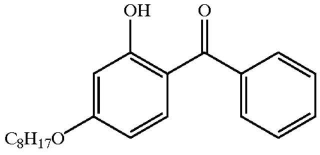

2-hydroxy-4(octyloxy)-benzophenone (manufactured by Aldrich Chemical Co., Ltd.)

D-12

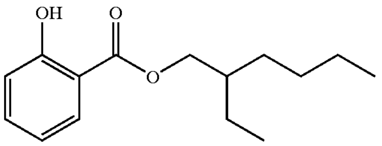

2-ethylhexyl salicylate (manufactured by Aldrich Chemical Co., Ltd.)

These compounds as the specific phenol compound (c) may be used either singly or in combination of two or more.

In the present invention, the amount of the specific phenol compound (c) to be added is 0.1 to 50% by weight, preferably 1.0 to 30% by weight based on the total solid content of the positive-type image-forming material. When the amount is too low, the effects of the present invention are not obtained. When the amount is too high, improvement of the effects is not considerably attained in particular. Rather, there arises a tendency that an alkali solubility are promoted to thereby lower an image-forming ability and film toughness in an unexposed area.

The image-forming material of the present invention is a material that exhibits an increased solubility in an aqueous alkaline solution by infrared exposure or by heating using a thermal head or the like. By using this material in a recording layer of a planographic printing plate precursor, a positive image is formed by carrying out a development processing with an aqueous alkaline solution. Use of the image-forming material of the present invention as a recording layer of a planographic printing plate precursor is illustrated below as an example. The recording layer relating to the present invention is a positive-type recording layer in which an alkali developability is improved by heating and an irradiated (exposure) area becomes a region of a non-image area.

Examples of positive-type recording layers, include a conventionally known acid catalytic decomposition system, an o-quinonediazide compound-containing system and an interaction releasing system (heat-sensitive positive) recording layers. These layers become soluble in water or an alkaline solution as a result of breaking the bonding within a polymer compound that has constituted a layer due to an acid or heat energy itself generated by light irradiation or heating, and are removed by development to form a non-image area.

The image-forming material of the present invention belongs to a so-called interaction releasing (heat-sensitive positive) image-forming material, and it comprises (a) an alkali-soluble resin, (b) a light-heat converting agent, (c) the foregoing phenol compound and, if desired, additives which can be used in combination therewith. These materials may constitute a recording layer of a monolayer construction containing all of the above components or a recording layer of a multilayer construction.

[(a) A water-insoluble, aqueous alkaline solution-soluble polymer compound]

The alkali-soluble resins (a) which can be used in the positive-type recording layer include a homopolymer containing an acid group in a main chain and/or a side chain of a polymer, a copolymer thereof and a mixture thereof.

Among these, polymer compounds having acid groups listed in (1) to (6) below in a main chain and/or a side chain of the polymer are preferable in view of solubility in an alkaline developing solution and dissolution inhibitory properties.

(1) phenol group (—Ar—OH), (2) sulfonamide group ($—SO_2NH—R$), (3) substituted sulfonamide type acid group (hereinafter referred to as an "active imide group") [$—SO_2NHCOR$, $—SO_2NHSO_2R$, $—CONHSO_2R$], (4) carboxylic acid group ($—CO_2H$), (5) sulfonic acid group ($—SO_3H$), and (6) phosphoric acid group ($—OPO_3H_2$)

In (1) to (6) listed above, Ar represents an optionally substituted divalent aryl linking group, and R represents an optionally substituted hydrocarbon group.

Among the alkali-soluble polymer compounds having the acid group selected from (1) to (6) above, alkali-soluble polymer compounds having (1) a phenol group, (2) a sulfonamide group and (3) an active imide group are preferable. In particular, alkali-soluble polymer compounds having (1) a phenol group or (2) a sulfonamide group are most preferable from the standpoint of securing solubility in an alkaline developing solution, development latitude and film toughness.

As alkali-soluble polymer compounds having the acid group selected from (1) to (6), the following compounds are mentioned.

Examples of the alkali-soluble polymer compounds having the phenol group (1) listed above include novolak resins such as a polycondensate of phenol and formaldehyde, a polycondensate of m-cresol and formaldehyde, a polycondensate of p-cresol and formaldehyde, a polycondensate of a mixture of m-cresol and p-cresol and formaldehyde and a polycondensate of phenol, cresol (any of m-cresol, p-cresol and a mixture of m-cresol and p-cresol) and formaldehyde, and a polycondensate of pyrogallol and acetone. Further, a copolymer obtained by copolymerizing a compound having a phenol group in a side chain is also available.

Examples of the compounds having the phenol group include acrylamide, methacrylamide, acrylic ester, methacrylic ester and hydroxystyrene having a phenol group.

In view of an image-forming property, it is advisable that the alkali-soluble polymer compounds have a weight average molecular weight of $5.0\times10^2$ to $2.0\times10^4$ and a number average molecular weight of $2.0\times10^2$ to 1.0 to $10^4$. These polymer compounds may be used either singly or in combination of two or more. When they are used in combination, a polycondensate of a phenol substituted with an alkyl group having 3 to 8 carbon atoms and formaldehyde, such as a polycondensate of t-butylphenol and formaldehyde or a polycondensate of octylphenol and formaldehyde as described in U.S. Pat. No. 4,123,279 and an aqueous alkaline solution-soluble polymer having a phenol structure in which an electron attractive group is present in an aromatic ring as described in JP-A No. 2000-241,972, which has previously been filed by the present inventors, may be used in combination.

The alkali-soluble polymer compounds having the sulfonamide group (2) listed above include the polymers composed of a minimum structural unit derived from the compound having a sulfonamide group as a main constituent. Such compounds include the compounds having at least one sulfonamide group in which at least one hydrogen atom is bound to a nitrogen atom and having at least one polymerizable unsaturated group in the molecule. Among others, low-molecular compounds having an acryloyl group, an allyl group or a vinyloxy group and having a substituted or mono-substituted aminosulfonyl group or a substituted sulfonylimino group in the molecule are preferable. For example, compounds represented by general formulas 1 to 5 shown below are listed.

General formula 1

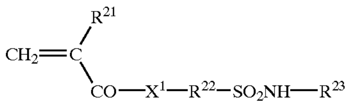

General formula 2

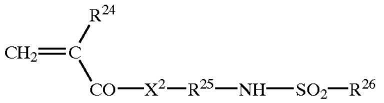

General formula 3

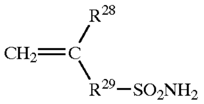

General formula 4

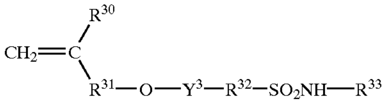

General formula 5

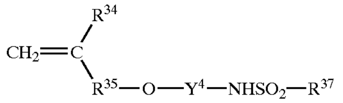

Wherein:

$X^1$ and $X^2$ each independently represent —O— or —$NR^{27}$—;

$R^{21}$ and $R^{24}$ each independently represent a hydrogen atom or —$CH_3$;

$R^{22}$, $R^{25}$, $R^{29}$, $R^{32}$ and $R^{36}$ each independently represent an optionally substituted alkylene, cycloalkylene, arylene or aralkylene group having 1 to 12 carbon atoms;

$R^{23}$, $R^{27}$ and $R^{33}$ each independently represent a hydrogen atom, or an optionally substituted alkyl, cycloalkyl, aryl group or aralkyl group having 1 to 12 carbon atoms;

$R^{26}$ and $R^{37}$ each independently represent an optionally substituted alkyl, cycloalkyl, aryl or aralkyl group having 1 to 12 carbon atoms;

$R^{28}$, $R^{30}$ and $R^{34}$ each independently represent a hydrogen atom or —$CH_3$;

$R^{31}$ and $R^{35}$ each independently represent a single bond, or an optionally substituted alkylene, cycloalkylene, arylene or aralkylene group having 1 to 12 carbon atoms; and $Y^3$ and $Y^4$ each independently represent a single bond or —CO—.

Among the compounds represented by general formulas 1 to 5 shown above, m-aminosulfonylphenyl methacrylate, N-(p-aminosulfonylphenyl)methacrylamide and N-(p-aminosulfonylphenyl)acrylamide can preferably be used in the positive-type planographic printing material of the present invention.

The alkali-soluble polymer compounds having the active imide group (3) listed above include the polymers composed of a minimum structural unit derived from the compound having an active imide group as a main constituent. As these compounds, the compounds having at least one active imide group represented by the following structural formula and at least one polymerizable unsaturated group in the molecule can be mentioned.

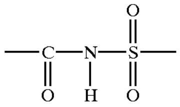

Specifically, N-(p-toluenesulfonyl)methacrylamide and N-(p-toluenesulfonyl)acrylamide can suitably be used.

The alkali-soluble polymer compounds having the carboxylic acid group (4) listed above include the polymers composed of a minimum structural unit derived from the compound having at least one carboxylic acid group and at least one polymerizable unsaturated group in the molecule as a main constituent.

The alkali-soluble polymer compounds having the sulfonic acid group (5) listed above include the polymers composed of a minimum structural unit derived from the compound having at least one sulfonic acid group and at least one polymerizable unsaturated group in the molecule as a main constituent.

The alkali-soluble polymer compounds having the phosphoric acid group (6) listed above include the polymers composed of a minimum structural unit derived from the compound having at least one phosphoric acid group and at least one polymerizable unsaturated group in the molecule as a main constituent.

The minimum structural unit, which constitutes the alkali-soluble polymer compound used in the positive-type recording layer and has the acid group selected from (1) to (6), is not necessarily one species. The copolymer composed of two or more minimum structural units having the same acid group or composed of two or more minimum structural units having the different acid groups may also be used.

In the copolymer, the compound having the acid group selected from (1) to (6) listed above for copolymerization is contained at preferably 10 mol % or more, more preferably 20 mol % or more. When the content is less than 10 mol %, there is a tendency that a development latitude cannot satisfactorily be increased.

The amount of the alkali-soluble resin (a) to be added is preferably 10 to 99% by weight, more preferably 25 to 90% by weight based on the total solid content of the image-forming material of the present invention. When the amount is less than 10% by weight, film toughness might be decreased. When the amount is too high, sensitivity and image-forming abilities tend to be impaired.

[(b) A light-heat converting agent]

The image-forming material of the present invention is a material which allows recording by heat-mode exposure, typically with a laser emitting infrared light, and the material is required to contain, other than the foregoing components, a light-heat converting agent.

By the combined use of this light-heat converting agent in the image-forming material of the present invention, an image-forming material is obtained which acquires a varying solubility in an aqueous alkaline solution by infrared exposure. And the use of the material in the recording layer of the planographic printing plate precursor improves developability of an exposed area through development with the aqueous alkaline solution after the infrared laser exposure to thus form a positive image in which an exposed area is a non-image area.

The light-heat converting agent used in the present invention is not particularly limited so long as the agent exhibits a light-heat converting ability to absorb light having a predetermined wavelength and then to convert the absorbed light into heat. In general, dyes or pigments absorbing light having a wavelength emitted from an infrared laser used for writing, namely, a maximum absorption wavelength in the region from 760 nm to 1,200 nm are listed.

As infrared absorption dyes that can be used in the present invention, commercially available dyes or known dyes described in literatures (for example, "*Senryo Binran*" ("Handbook of Dyes"), edited by The Society of Synthetic Organic Chemistry, 1970) are employed. Specific examples thereof include azo dyes, metal complex azo dyes, pyrazolone azo dyes, anthraquinone dyes, phthalocyanine dyes, carbonium dyes, quinoneimine dyes, methine dyes, cyanine dyes, diimonium dyes and aminium dyes.

Preferable examples of dyes include cyanine dyes described in JP-A Nos. 58-125,246, 59-84,356, 59-202,829 and 60-78,787, methine dyes described in JP-A Nos. 58-173,696, 58-181,690 and 58-194,595, naphthoquinone dyes described in JP-A Nos. 58-112,793, 58-224,793, 59-48,187, 59-73,996, 60-52,940 and 60-63,744, squarylium dyes described in JP-A No. 58-112,792 and cyanine dyes described in British Patent No. 434,875.

Further, near infrared absorbing sensitizers described in U.S. Pat. No. 5,156,938 are suitably used. Moreover, substituted arylbenzo(thio)pyrylium salts described in U.S. Pat. No. 3,881,924, trimethinethiapyrylium salts described in JP-A No. 57-142,645 (U.S. Pat. No. 4,327,169), pyrylium-base compounds described in JP-A Nos. 58-181,051, 58-220,143, 59-41,363, 59-84,248, 59-84,249, 59-146,063 and 59-146,061, cyanine colorants described in JP-A No. 59-216,146, pentamethinethiopyrylium salts described in U.S. Pat. No. 4,283,475 and pyrylium compounds disclosed in JP-B Nos. 5-13,514 and 5-19,702 are also preferably used.

Other preferable examples of dyes include near infrared absorbing dyes represented by formulas (I) and (II) shown in U.S. Pat. No. 4,756,993.

Among these dyes, cyanine colorants, phthalocyanine dyes, oxonol dyes, squarylium colorants, pyrylium salts, thiopyrylium dyes and nickel oleate complexes are especially preferable. Further, dyes represented by the following formulas (1) to (5) are preferable because of their excellent light-heat converting efficiency. In particular, cyanine dyes represented by the following formula (1) are most preferable because they can provide a high polymerizing activity and are excellent in stability and economy when used in the polymerizable composition of the present invention.

Formula (1)

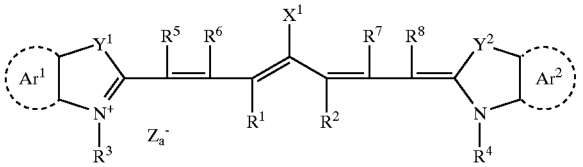

In formula (1) shown above, $X^1$ represents a hydrogen atom, a halogen atom, —$NPh_2$, $X^2$-$L^1$ or a group represented by the following formula, in which $X^2$ represents an oxygen atom or a sulfur atom, $L^1$ represents a hydrocarbon group having 1 to 12 carbon atoms, a heteroatom-containing aromatic ring or a heteroatom-containing hydrocarbon group having 1 to 12 carbon atoms. The heteroatom described herein indicates N, S, O, a halogen atom or Se.

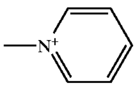

$R^1$ and $R^2$ each independently represent a hydrocarbon group having 1 to 12 carbon atoms. In view of storability of a coating solution for a photosensitive layer, $R^1$ and $R^2$ are preferably hydrocarbon groups having 2 or more carbon atoms. Particularly preferable are $R^1$ and $R^2$ that are bound to each other to form a 5-membered or 6-membered ring.

$Ar^1$ and $Ar^2$, which may be the same or different, each represent an optionally substituted aromatic hydrocarbon group. Preferable examples of the aromatic hydrocarbon groups include a benzene ring and a naphthalene ring. Further, preferable examples of the substituents include a hydrocarbon group having 12 or less carbon atoms, a halogen atom and an alkoxy group having 12 or less carbon atoms. $Y^1$ and $Y^2$, which may be the same or different, each represent a sulfur atom or a dialkylmethylene group having 12 or less carbon atoms. $R^3$ and $R^4$, which may be the same or different, each represent an optionally substituted hydrocarbon group having 20 or less carbon atoms. Preferable examples of the substituents include an alkoxy group having 12 or less carbon atoms, a carboxyl group and a sulfo group. $R^5$, $R^6$, $R^7$ and $R^8$, which may be the same or different, each represent a hydrogen atom or a hydrocarbon group having 12 or less carbon atoms, preferably a hydrogen atom in view of availability of the starting material. Further, $Za^-$ represents a counter anion, with a proviso that when any of $R^1$ to $R^8$ is substituted with a sulfo group, $Za^-$ is unnecessary. Preferable examples of $Za^-$ include a halogen ion, a perchlorate ion, a tetrafluoroborate ion, a hexafluorophosphate ion and a sulfonate ion in view of storability of a coating solution for a photosensitive layer. A perchlorate ion, a hexafluorophosphate ion and an arylsulfonate ion are particularly preferable.

Specific examples of cyanine dyes represented by formula (1), which are preferably used in the present invention include, in addition to the dyes shown below, those described in Japanese Patent Application No. 11-310,623, paragraphs [0017] to [0019], Japanese Patent Application No. 2000-224,031, paragraphs [0012] to [0038] and Japanese Patent Application No. 2000-211,147, paragraphs [0012] to [0023].

-continued
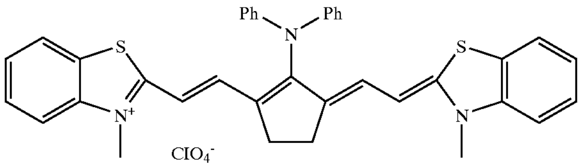
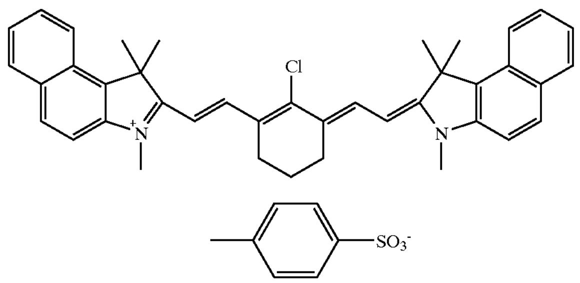
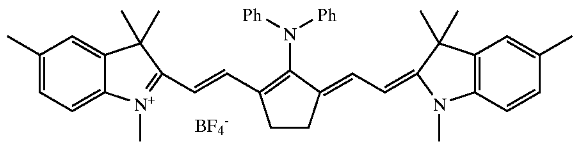
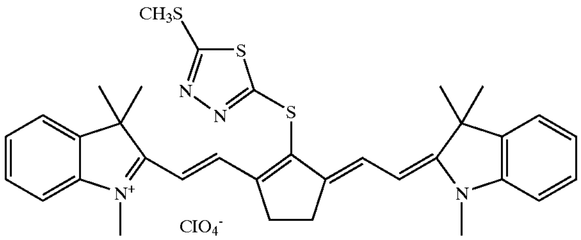
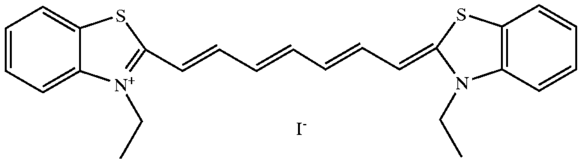
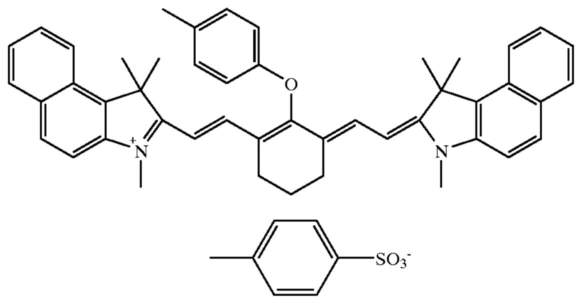
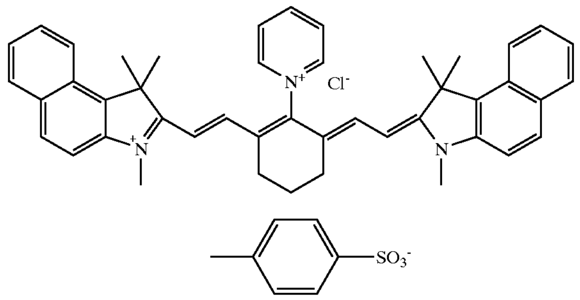
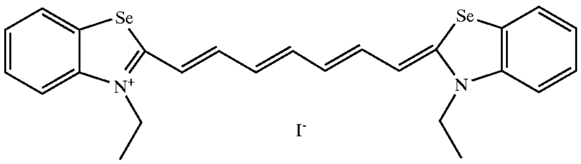
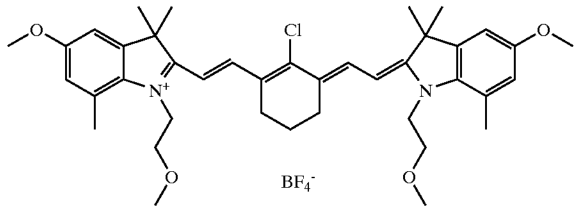
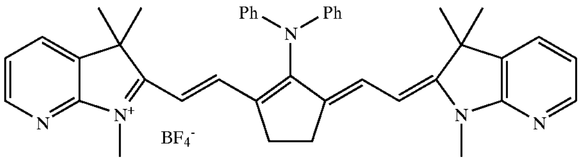
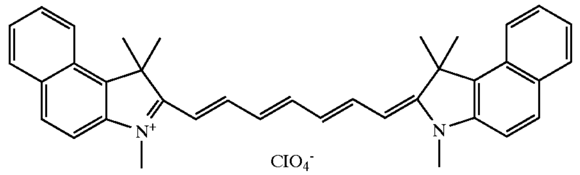
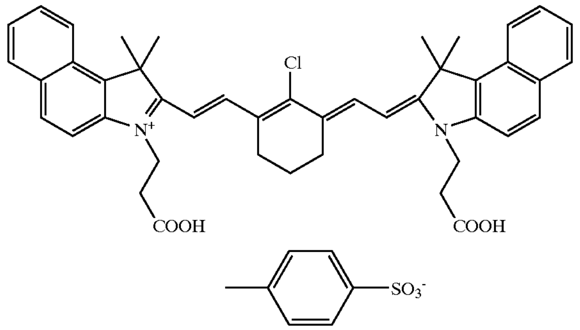
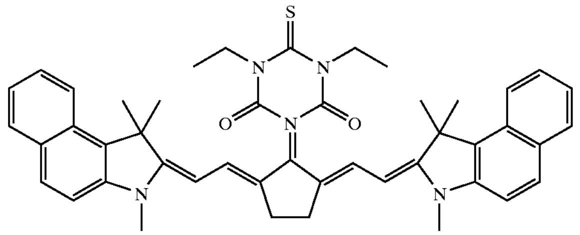
Formula (2)
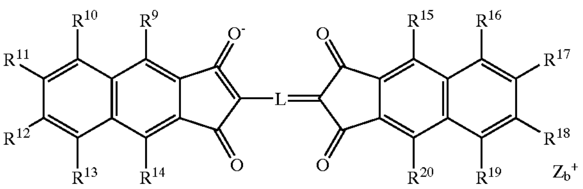
In formula (2) shown above, L represents a methine chain having 7 or more conjugated carbon atoms. This methine chain may optionally be substituted, and the substituents may be bound to each other to form a ring structure. $Zb^+$ represents a counter cation. Preferable examples of the counter cations include ammonium, iodonium, sulfonium, phosphonium, pyridinium and an alkali metal cation ($Ni^+$, $K^+$ or $Li^+$). $R^9$ to $R^{14}$ and $R^{15}$ to $R^{20}$ each independently represent a hydrogen atom, a halogen atom or a substituent selected from a cyano group, an alkyl group, an aryl group, an alkenyl group, an alkinyl group, a carbonyl group, a thio group, a sulfonyl group, a sulfinyl group, an oxy group and an amino group, or a substituent of a combination of two or three of these, and they may be bound to each other to form a ring structure. Among the compounds represented by formula (2) shown above, those in which L is a methine chain having 7 or more conjugated carbon atoms and $R^9$ to $R^{14}$ and $R^{15}$ to $R^{20}$ are all hydrogen atoms are preferable in view of availability and effects.

Specific examples of the dyes represented by formula (2) shown above, which can suitably be used in the present invention, include the following dyes.

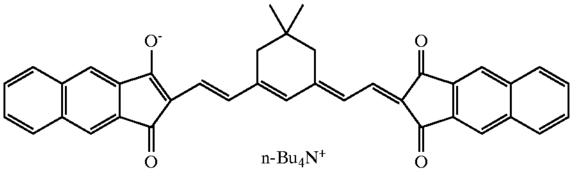

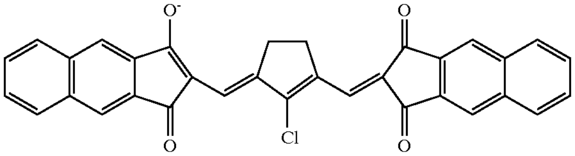

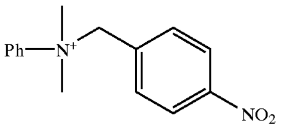

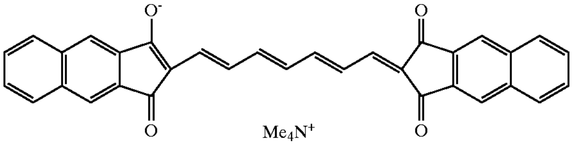

Formula (3)

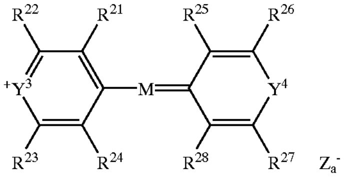

In formula (3) shown above, $Y^3$ and $Y^4$ each independently represent an oxygen atom, a sulfur atom, a selenium atom or a tellurium atom. M represents a methine chain having 5 or more conjugated carbon atoms. $R^{21}$ to $R^{24}$ and $R^{25}$ to $R^{28}$, which may be same or different, each represent a hydrogen atom, a halogen atom, a cyano group, an alkyl group, an aryl group, an alkenyl group, an alkinyl group, a carbonyl group, a thio group, a sulfonyl group, a sulfinyl group, an oxy group or an amino group. Further, in formula (3), $Za^-$ represents a counter anion which has the same meaning as $Za^-$ in formula (1).

Specific examples of the dyes represented by formula (3), which can suitably be used in the present invention, include the following dyes.

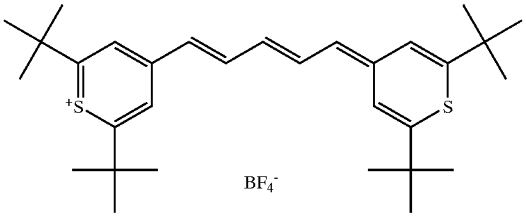

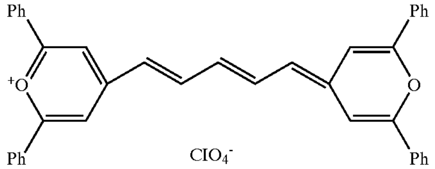

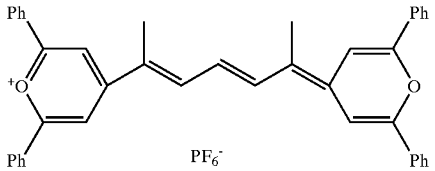

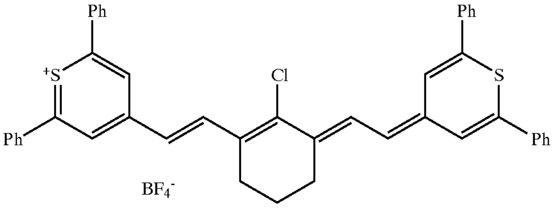

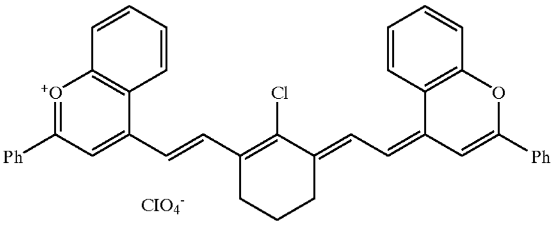

Formula (4)

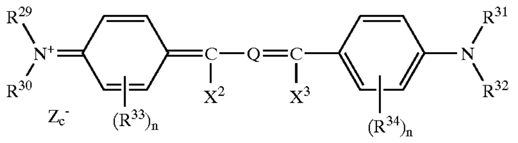

In formula (4) shown above, $R^{29}$ to $R^{31}$ each independently represent a hydrogen atom, an alkyl group or an aryl group. $R^{33}$ and $R^{34}$ each independently represent an alkyl group, a substituted oxy group or a halogen atom. n and m each independently represent an integer of 0 to 4. $R^{29}$ and $R^{30}$, or $R^{31}$ and $R^{32}$ may be bound to each other to form a ring. $R^{29}$ and/or $R^{30}$ and $R^{33}$, and $R^{31}$ and/or $R^{32}$ and $R^{34}$ may be bound to each other to form a ring. Further, when plural $R^{33}$'s or $R^{34}$'s are present, $R^{33}$'s or $R^{34}$'s may be bound to each other to form a ring. $X^1$ and $X^2$ each independently represent a hydrogen atom, an alkyl group or an aryl group, and at least one of $X^1$ and $X^2$ represents a hydrogen atom or an alkyl group. Q is an optionally substituted trimethine group or pentamethine group which may form a ring structure with a divalent organic group. $Zc^-$ represents a counter anion, and has the same meaning as $Za^-$ in formula (1).

Specific examples of the dyes represented by formula (4) shown above, which can preferably be used in the present invention, include the following dyes.

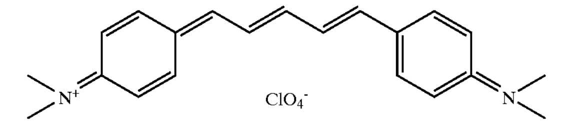

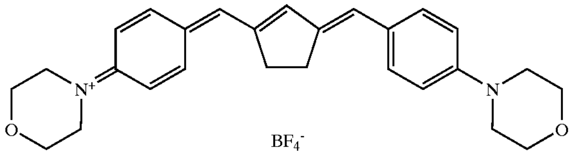

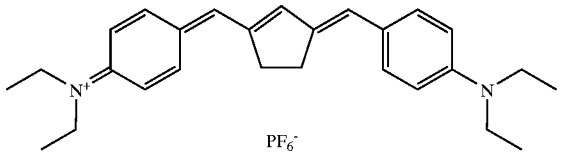

Formula (5)

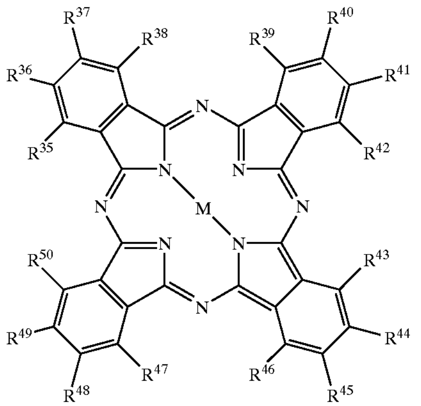

In formula (5) shown above, $R^{35}$ to $R^{50}$ each independently represent a hydrogen atom, a halogen atom, a cyano group, an optionally substituted alkyl group, aryl group, alkenyl group or alkynyl group, a hydroxyl group, a carbonyl group, a thio group, a sulfonyl group, a sulfinyl group, an oxy group, an amino group or an onium salt structure. M represents two hydrogen atoms or metal atoms, a halometal group or an oxymetal group. Examples of the metal atoms contained therein include atoms of the IA, IIA, IIIB and IVB groups, transition metals in the 1st, 2nd and 3rd periods and lanthanoid elements in the periodic table. Among these, copper, magnesium, iron, zinc, cobalt, aluminum, titanium and vanadium are preferable.

Specific examples of the dyes represented by formula (5), which can appropriately be used in the present invention, include the following dyes.

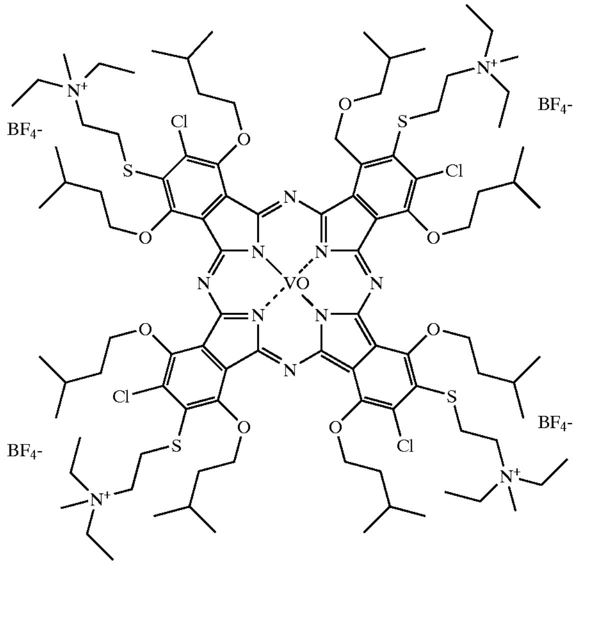

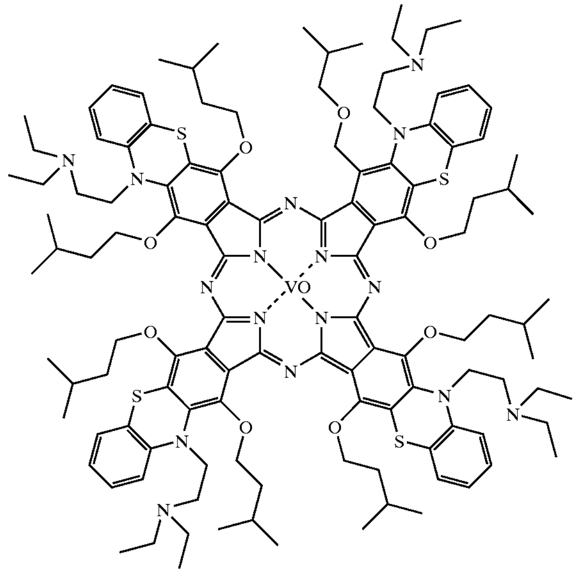

In the present invention, these infrared absorbing dyes can be used either singly or in combination of two or more. In view of sensitivity, a combination of the dye represented by formula (1) and an iodonium salt or a sulfonium salt represented by formula (5) or (6) is most preferable.

Examples of the pigments used as the light-heat converting agent in the present invention include commercially available pigments and the pigments described in Color Index (C. I.) handbook, "*Saishin Ganryo Binran*" ("Handbook of New Pigments", edited by Japan Society of Color Material, 1977), "*Saishin Ganryo Oyo Gijutsu*" ("Handbook of New Pigment Applications", CMC Shuppan, 1986) and "Insatsu Ink Gijutsu" ("Printing Ink Techniques", CMC Shuppan, 1984).

Examples of the species of pigments include a black pigment, a yellow pigment, an orange pigment, a brown pigment, a red pigment, a purple pigment, a blue pigment, a green pigment, a fluorescent pigment, a metal powder pigment and a polymer-bound pigment. Specific examples thereof include an insoluble azo pigment, an azo lake pigment, a condensed azo pigment, a chelate azo pigment, a phthalocyanine pigment, an anthraquinone pigment, perylene and perynone pigments, a thioindigo pigment, a quinacridone pigment, a dioxazine pigment, an isoindolinone pigment, a quinophthalone pigment, a dyeing lake pigment, an azine pigment, a nitroso pigment, a nitro pigment, a natural pigment, a fluorescent pigment, an inorganic pigment and a carbon black. Among these pigments, a carbon black is preferable.

These pigments may be used with or without surface treatment. As the surface treatment method, a method in which a resin or a wax is coated on a surface, a method of adhering a surfactant and a method in which a reactive substance (for example, a silane coupling agent, an epoxy compound or a polyisocyanate) is bound to a surface of the pigment are mentioned. These surface treatment methods are described in "*Kinzoku Sekken no Seishitsu to Oyo*" ("Characteristics and Application of Metal Soaps", Saiwai Shobo), "*Insatsu Ink Gijutsu*" ("Printing Ink Techniques", CMC Shuppan, 1984) and "*Saishin Ganryo Oyo Binran*" ("Handbook of New Pigment Applications", CMC Shuppan, 1986).

The particle diameter of the pigment is preferably 0.01 μm to 10 μm, more preferably 0.05 μm to 1 μm, especially preferably 0.1 μm to 1 μm. When the particle diameter of the pigment is less than 0.01 μm, stability of a dispersion in a coating solution for an image photosensitive layer is impaired. When the diameter exceeds 10 μm, uniformity of an image photosensitive layer is affected.

The pigment can be dispersed by known dispersion techniques used in production of ink or production of toners. Examples of dispersing devices include an ultrasonic dispersing machine, a sand mill, an attritor, a pearl mill, a super mill, a ball mill, an impeller, a disperser, a KD mill, a colloid mill, a dynatron, a three-roll mill and a pressure kneader. Details are described in "*Saishin Ganryo Oyo Binran*" ("Handbook of New Pigment Applications", CMC Shuppan, 1986).

These light-heat converting agents are added for the purpose of making the image-forming material of the present invention compatible with the heat-mode. The light-heat converting agent may be added to the same layer as the other components included, or to another layer to be provided separately. The amount thereof to be added is preferably 0.01 to 20% by weight, more preferably 0.5 to 10% by weight based on the total solid content of the image-forming material. When the addition amount is less than 0.01% by weight, sensitivity tends to be decreased. When it exceeds 20% by weight, storability of the image-forming material and film properties of the recording layer are adversely affected. Thus, the addition amount outside the above range is not preferred.

Additional Components

In the image recording material of the present invention, the conventionally known additives for image recording materials described below can selectively be used which are capable of recording with an infrared laser or by heating.

Examples of the additives that can be used in the image-forming material of the present invention include another onium salt, an aromatic sulfone compound, an aromatic sulfonic acid ester compound and a polyfunctional amine compound. These are added to improve a dissolution preventive function of an alkali-soluble resin to a developing solution.

Examples of the onium salt include a diazonium salt, an ammonium salt, a phosphonium salt, an iodonium salt, a sulfonium salt, a selenonium salt and an arsonium salt. The amount of the onium salt to be added is preferably 1 to 50% by weight, more preferably 5 to 30% by weight, particularly preferably 10 to 30% by weight based on the total solid content constituting the image-forming material.

Further, for improving sensitivity, cyclic acid anhydrides, phenols and organic acids can be used in combination. Examples of the cyclic acid anhydrides can include phthalic anhydride, tetrahydrophthalic anhydride, hexahydrophthalic anhydride, 3,6-endooxy-Δ4-tetrahydrophthalic anhydride, tetrachlorophthalic anhydride, maleic anhydride, chloromaleic anhydride, α-phenylmaleic anhydride, succinic anhydride and pyromellitic anhydride described in U.S. Pat. No. 4,115,128. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane. Moreover, examples of the organic acid include sulfonic acids, sulfinic acids, alkylsulfates, phosphonic acids, phosphoric acid esters and carboxylic acids described in JP-A Nos. 60-88,942 and 2-96,755.

The proportions of the cyclic acid anhydrides, the phenols and the organic acids to be included in the image-forming material is preferably 0.05 to 20% by weight, more preferably 0.1 to 15% by weight, particularly preferably 0.1 to 10% by weight.

Moreover, an epoxy compound, vinyl ethers and a crosslinkable compound having alkali dissolution inhibitory properties which have previously been proposed by the present inventors in JP-A No. 11-160,860 can properly be added, besides the foregoing compounds, according to the purposes.

In addition, for enhancing stability during processing under development conditions, a nonionic surfactant described in JP-A Nos. 62-251,740 and 3-208,514 and an ampholytic surfactant described in JP-A Nos. 59-121,044 and 4-13,149 can be added to the image-forming material of the present invention.

A printing-out agent for obtaining a visible image immediately after heating by light exposure as well as a dye or a pigment as an image colorant can be added to the image-forming material of the present invention.

Moreover, for imparting flexibility to a film, a plasticizer is added, as necessary, to the image-forming material of the present invention. Examples thereof include polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and an oligomer or a polymer of an acrylic acid or methacrylic acid.

A planographic printing plate precursor can be produced by coating, onto an appropriate substrate, a coating solution for a recording layer containing the image-forming material of the present invention or a coating solution for a desired layer such as a protecting layer after having dissolved essential components in a solvent.

Examples of the solvent used herein include, but are not limited to, ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene and water. They are used either singly or in combination. The concentrations of the foregoing ingredients (total solid content containing the additives) in the solvent are preferably 1 to 50% by weight.

The coating amount (solid content) on the substrate obtained after dried varies with the use. With respect to the recording layer of the planographic printing plate precursor capable of recording with an infrared laser, the preferred amount is usually 0.5 to 5.0 $g/m^2$.

As a coating method, various methods can be employed. Examples thereof include coating with a bar coater, rotational coating, spray coating, curtain coating, dip coating, air knife coating, blade coating and roll coating. The smaller the coating amount applied, the higher the apparent sensitivity obtained, but sacrificing film properties of the recording layer.

To the coating solution for a recording layer using the image-forming material of the present invention may be added a surfactant for improving coatability, such as a fluorine-based surfactant described in JP-A No. 62-170,950. The amount thereof is preferably 0.01 to 1% by weight, more preferably 0.05 to 0.5% by weight based on the total image-forming material.

When the planographic printing plate precursor is produced using the image-forming material of the present invention, the coating solution for the recording layer containing this image-forming material can be applied onto a substrate to form the recording layer. As the substrate used at this time, a dimensionally stable plate-like material is used. Examples thereof include paper, paper laminated with plastics (for example, polyethylene, polypropylene and polystyrene), metallic plates (for example, aluminum, zinc and copper), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal), and paper or plastic films laminated or deposited with the foregoing metals.

As the substrate used in the planographic printing plate precursor of the present invention, a polyester film and an aluminum plate are preferable. An aluminum plate is particularly preferable because it is dimensionally stable and relatively inexpensive. A preferable aluminum plate is a pure aluminum plate or an alloy plate mainly made of aluminum with trace amounts of hetero elements. Further, a plastic film laminated or deposited with aluminum can also be used. Examples of the hetero elements contained in the aluminum alloy include silicon, iron, manganese, copper, magnesium, chromium, zinc, bismuth, nickel and titanium. The contents of the hetero elements in the alloy are at most 10% by weight. Particularly preferable aluminum used in the present invention is pure aluminum. However, since completely pure aluminum is difficult to produce from the standpoint of a refining technique, aluminum with minute amounts of the hetero elements included may be used. Thus, there is no particular limitation to the composition of the aluminum plate used in the present invention, and conventionally known aluminum plates containing other elements can be used. The thickness of the aluminum plate used in the present invention is 0.1 mm to 0.6 mm, preferably 0.15 mm to 0.4 mm, more preferably 0.2 mm to 0.3 mm.

Prior to surface roughening of the aluminum plate, degreasing treatment is conducted with, for example, a surfactant, an organic solvent or an aqueous alkaline solution, as required, for removing calendering oil present on the surface.

The surface of the aluminum plate is roughened by various methods, for example, a method of mechanically roughening a surface, a method of electrochemically dissolving and roughening a surface or a method of chemically dissolving a surface selectively. In the mechanical method, known methods such as a ball polishing method, a brush polishing method, a blast polishing method and a buff polishing method can be used. As the electrochemical surface roughening method, there is mentioned a method in which a surface is roughened in an electrolyte containing a hydrochloric acid or an electrolyte containing nitric acid with an alternating current or a direct current applied. Further, a combination of these methods can be used as disclosed in JP-A No. 54-63,902.

The aluminum plate thus surface-roughened is subjected to alkali etching treatment and subsequent neutralization as required, followed by anodization for increasing moisture retention or wear resistance of the surface, as desired. As an electrolyte used for anodizing the aluminum plate, various electrolytes forming a porous oxide film are usable. Generally, sulfuric acid, phosphoric acid, oxalic acid, chromic acid or a mixture thereof is used. The concentration of the electrolyte is suitably determined depending on the species of the electrolyte used.

The conditions for anodization vary with the electrolyte used, and are not specifically limited. Generally, it is advisable that the concentration of the electrolyte is 1 to 80% by weight, a liquid temperature is 5 to 70° C., a current density is 5 to 60 $A/dm^2$, a voltage is 1 to 100 V and an electrolysis duration is 10 seconds to 5 minutes.

After anodized, the aluminum surface is subjected to hydrophilizing treatment as required. As the hydrophilizing treatment used in the present invention, there is mentioned an alkali metal silicate (for example, an aqueous sodium silicate solution) method disclosed in U.S. Pat. Nos. 2,714,066, 3,181,461, 3,280,734 and 3,902,734. In this method, the substrate is dipped in the aqueous sodium silicate solution or subjected to electrolysis. Further, there are mentioned a method of treating the surface with potassium fluorozirconate as disclosed in Japanese Patent Publication No. 22,063/1961 and a method of treating the surface with polyvinyl sulfonate as disclosed in U.S. Pat. Nos. 3,276,868, 4,153,461 and 4,689,272.

The planographic printing plate precursor of the present invention has a substrate and having formed thereon a recording layer containing the image-forming material of the present invention. If necessary, a subbing layer can be formed therebetween.

As the components for constituting the subbing layer, various organic compounds are used. Examples thereof include carboxymethyl cellulose, dextrin, gum arabic, amino group-containing phosphonic acids such as 2-aminoethylphosphonic acid, organic phosphonic acids such as optionally substituted phenylphosphonic acid, naphthylphosphonic acid, alkylphosphonic acid, glycerophosphonic acid, methylenediphosphonic acid and ethylenediphosphonic acid, organic phosphoric acids such as optionally substituted phenylphosphoric acid, naphthylphosphoric acid, alkylphosphoric acid and glycerophosphoric acid, organic phosphinic acids such as optionally substituted phenylphosphinic acid, naphthylphosphinic acid, alkylphosphinic acid and glycerophosphinic acid, amino acids such as glycine and β-alanine, and hydroxy group-containing amine hydrochlorides such as ethanolamine hydrochloride. These may be used as a mixture thereof. Also, polymer compounds containing a unit capable of interacting with an alumina layer and a unit capable of interacting with a hydrophilized layer, as described in Japanese Patent Laid-Open No. 109, 641/1999, can be used appropriately.

The planographic printing plate precursor produced as above is usually imagewise heated or subjected to infrared exposure, followed by development for image-forming. For image-forming, direct heating by means of a thermal head and imagewise exposure with actinic light are employed.

When the image-forming material of the present invention is used as the material compatible with the heat-mode, a solid state laser or a semiconductor laser that emits infrared light having a wavelength of 720 to 1,200 nm is preferably used. A solid state laser or a semiconductor laser having emission wavelengths from a near infrared to an infrared region is particularly preferable as a light source.

In the present invention, the development processing may be conducted immediately after exposure. Heat treatment (post heating) may be conducted between the exposing step and the developing step. When heat treatment is conducted, suitable conditions are adopted which employ the temperature from 40 to 200° C., preferably from 50 to 180° C., more preferably from 60 to 150° C. and the duration of 2 seconds to 10 minutes, preferably 5 seconds to 5 minutes. As the heating method, various known methods may be used. Examples thereof include a method in which a panel heater or a ceramic heater is used while contacting with a recording material, and a non-contact heating method in which a lamp or hot air is used. This heat treatment can reduce laser energy required for recording by irradiation with a laser.

As a developing solution and a replenisher used for the planographic printing plate precursor of the present invention, conventionally known aqueous alkaline solutions can be used. Examples thereof include inorganic alkaline salts such as sodium silicate, potassium silicate, sodium tertiary phosphate, potassium tertiary phosphate, ammonium tertiary phosphate, sodium secondary phosphate, potassium secondary phosphate, ammonium secondary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Further, organic alkali compounds such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine may also be used.

These alkaline agents are used either singly or in combination of two or more.

Particularly preferable examples of the developing solutions containing these alkaline agents include aqueous solutions of silicates such as sodium silicate and potassium silicate, because developability can be controlled by varying the ratio of silicon oxide $SiO_2$ used as ingredients of the silicate to an alkaline metal oxide $M_2O$ and the concentrations thereof. For example, alkali metal silicates described in JP-A No. 54-62,004 and JP-B No. 57-7,427 are effectively used.

When development is conducted using an automatic developing machine, it is known that a larger number of PS plates can be processed by adding an aqueous solution (replenisher) having a higher alkalinity than that of a developing solution to the developing solution, without replacing the developing solution in a development tank for a long period of time. This replenishing system is also preferably applied to the present invention. To the developing solution and the replenisher, various surfactants and organic solvents can be added, as required, for the purpose of accelerating or suppressing developability, of dispersing sediments after development, and of increasing an affinity for ink on an image area of a printing plate. Preferable examples of the surfactant include anionic, cationic, nonionic and ampholytic surfactants.

The developing solution and the replenisher solution may contain a reducing agent such as hydroquinone, resorcinol, and a salt of inorganic acid, e.g., sodium or potassium sulfite and sodium or potassium hydrogensulfite, an organic carboxylic acid, a defoaming agent and an agent to convert hard water into soft water.

The printing plate, after having been developed with a developing solution and a replenisher, is subjected to post-treatment with a rinsing solution that contains washing water and a surfactant or a desensitizing solution that contains gum arabic or starch derivatives. The post-treatment using the image recording material of the present invention as a printing plate may employ these treatments in combination.

In recent years, in the plate-making and printing industries, an automatic developing machine for preparing a printing plate has been widely used so as to rationalize and standardize the plate-making work. The automatic developing machine is generally composed of a development section and a post-treatment section, and further comprises a device for transporting printing plates, respective processing solution tanks and a spray unit. While printing plates after exposure are horizontally transported, respective processing solutions pumped up are sprayed from a spray nozzle for development processing. Further, there is known a method in which printing plates are processed while transporting and dipping them in a tank filled with a processing solution using a submerged guide roll. In such an automatic processing, printing plates can be processed while a replenisher is being supplied to respective processing solutions, depending on the processing amount, operating duration and the like applied.

Moreover, a so-called disposal processing method may also be applied in which printing plates are processed with a substantially virgin processing solution.

The planographic printing plate precursor made of the image-forming material of the present invention is described below. When an unnecessary image area (for example, a film edge mark on an original film) is produced in a planographic printing plate, which is caused by image exposure, water-washing and/or rinsing and/or gumming, the unnecessary image area should be erased. This erasing is preferably conducted by a method in which an unnecessary image area is coated with an erasing solution, allowed to stand for a predetermined period of time, followed by washing with water as described in JP-B No.2-13,293. Another method can also be used in which development is conducted after irradiating the unnecessary image area with actinic light guided by an optical fiber, as described in JP-A No. 59-174, 842.

The thus-obtained planographic printing plate can be coated with desensitizing gum, as required, and then subjected to a printing step. If a planographic printing plate is required which achieve a higher printing resistance, the plate is further subjected to burning treatment.

When burning treatment is employed, it is advisable that prior to the treatment, the planographic printing plate is treated with a surface-leveling solution as described in JP-B Nos. 61-2,518 and 55-28,062 and JP-A Nos. 62-31,859 and 61-159,655.

As this method, applicable are those methods including, for example, a method in which a surface-leveling solution is coated on the planographic printing plate using a sponge or an absorbent cotton impregnated with the solution, a method in which the printing plate is coated with a surface-leveling solution by dipping using a vat filled with the solution or a method of coating using an automatic coater. Further, use of a squeegee or a squeegee roll after coating produces better results since uniform coating amounts can be achieved. The coating amount of the surface-leveling solution is usually specified within a range from 0.03 to 0.8 $g/m^2$ (dry weight).

If necessary, the planographic printing plate coated with the surface-leveling solution is subjected, after dried, to heating to an elevated temperature using a burning processor (for example, a burning processor "BP-1300" sold by Fuji Photo Film Co., Ltd.). Preferably, heating temperatures and heating duration are specified within a range from 180 to 300° C. and 1 to 20 minutes, respectively, depending on the species of the components used for forming the image.

The planographic printing plates thus burning treated are subjected, as necessary, to conventionally conducted treatments such as water-washing, gumming and the like. However, when a surface-leveling solution containing a water-soluble high-molecular compound or the like is used, desensitizing treatment such as gumming may be obviated.

The thus-obtained planographic printing plate is loaded onto an offset printing machine and used for printing a large number of sheets.

EXAMPLES

The present invention is illustrated below by referring to Examples. However, the present invention is not limited thereto.

Production of a Substrate

An aluminum plate (material 1050) having a thickness of 0.30 mm was cleaned with trichloroethylene for degreasing, and its surface was then grained with a nylon brush and a 400-mesh pumice powder suspension, and thoroughly washed with water. This plate was dipped in a 25% aqueous sodium hydroxide solution of 45° C. for 9 seconds for etching, and washed with water. Further, the plate was dipped in 20% nitric acid for 20 seconds, and washed with water. At this time, the etching amount of the grained surface was approximately 3 $g/m^2$. Subsequently, this plate was subjected to D.C. anodization using 7% sulfuric acid as an electrolyte and a current density of 15 $A/dm^2$ to form 3 $g/m^2$ of an oxide layer. The resulting plate was then washed with water, dried, and further treated with an aqueous solution containing 2.5% by weight of sodium silicate at 30° C. for 10 seconds. The following solution for forming a subbing layer was coated onto the resultant plate, followed by drying at 80° C. for 15 seconds to produce a substrate. The coating amount of the layer after dried was 15 $mg/m^2$.

| [Coating solution for a subbing layer] | |
|---|---|
| compound shown below | 0.3 g |
| methanol | 100 g |
| water | |

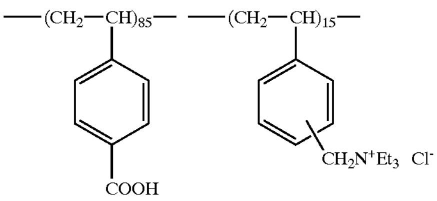

M.W. 28,000

Example 1

The following photosensitive solution 1 was coated on the thus-obtained substrate in a coating amount of 1.0 $g/m^2$, followed by drying at 140° C. for 50 seconds with PERFECT OVEN PH200 manufactured by Tabai Corporation by setting Wind Control at 7 to thereby obtain a planographic printing plate precursor 1.

| [Photosensitive solution 1] | |
|---|---|
| m,p-cresol novolak (m/p ratio = 6/4, weight average molecular weight 3,500, containing 0.5% by weight of unreacted cresol) | 0.427 g |
| specific phenol compound (D-1) | 0.047 g |
| specific copolymer 1 described in Japanese Patent Laid-Open No. 288,093/1999 | 2.37 g |
| cyanine dye A (having the structure shown below) | 0.155 g |
| 2-methoxy-4-(N-phenylamino)benzenediazonium hexafluorophosphate | 0.03 g |
| tetrahydrophthalic anhydride | 0.19 g |
| compound in which a counter ion of Ethyl Violet is 6-hydroxy-β-naphthalenesulfonic acid | 0.05 g |
| fluorine-based surfactant (MEGAFAC F176PF made by Dainippon Ink And Chemicals, Inc.) | 0.035 g |
| fluorine-based surfactant (MEGAFAC MCF-312 made by Dainippon Ink And Chemicals, Inc.) | 0.05 g |
| p-toluenesulfonic acid | 0.008 g |
| bis-p-hydroxyphenylsulfone | 0.063 g |
| n-dodecyl stearate | 0.06 g |

-continued

| [Photosensitive solution 1] | |
|---|---|
| γ-butyrolactone | 13 g |
| methyl ethyl ketone | 24 g |
| 1-methoxy-2-propanol | 11 g |
| Cyanine dye A | |

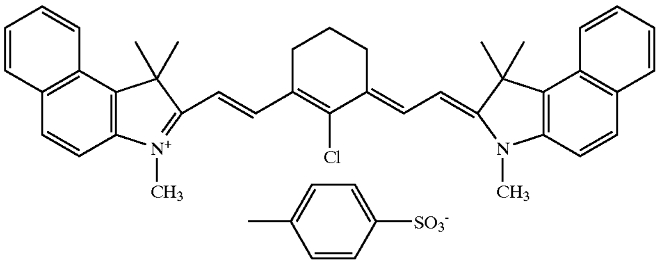

Example 2

The following photosensitive solution 2 was coated on the same substrate as used in Example 1 in a coating amount of 1.6 g/$m^2$, and the resulting substrate was dried under the same conditions as in Example 1 to obtain a planographic printing plate precursor 2.

| [Photosensitive solution 2] | |
|---|---|
| m,p-cresol novolak (m/p ratio = 6/4, weight average molecular weight 5,000, containing 0.5% by weight of unreacted cresol) | 2.00 g |
| specific phenol compound (D-2) | 0.25 g |
| octylphenol novolak (weight average molecular weight: 2,500) | 0.015 g |
| cyanine dye A | 0.105 g |
| 2-methoxy-4-(N-phenylamino)benzenediazonium hexafluorophosphate | 0.03 g |
| tetrahydrophthalic anhydride | 0.10 g |
| compound in which a counter ion of Ethyl Violet is 6-hydroxy-β-naphthalenesulfonic acid | 0.063 g |
| fluorine-based surfactant (MEGAFAC F176PF made by Dainippon Ink And Chemicals, Inc.) | 0.035 g |
| fluorine-based surfactant (MEGAFAC MCF-312 made by Dainippon Ink And Chemicals, Inc.) | 0.13 g |
| bis-p-hydroxyphenylsulfone | 0.08 g |
| methyl ethyl ketone | 16 g |
| 1-methoxy-2-propanol | 10 g |

Examples 3 to 12

Planographic printing plate precursors 3 to 12 were produced in the same manner as in Example 1 except that specific phenol compounds shown in Table 5 were used instead of the specific phenol compound (D-1) in the photosensitive solution 1 of Example 1.

TABLE 5

| | | (c) Specific phenol compound |
|---|---|---|
| Example 3 | Planographic printing plate precursor 3 | D-3 |
| Example 4 | Planographic printing plate precursor 4 | D-4 |
| Example 5 | Planographic printing plate precursor 5 | D-5 |

TABLE 5-continued

| | | (c) Specific phenol compound |
|---|---|---|
| Example 6 | Planographic printing plate precursor 6 | D-6 |
| Example 7 | Planographic printing plate precursor 7 | D-7 |
| Example 8 | Planographic printing plate precursor 8 | D-8 |
| Example 9 | Planographic printing plate precursor 9 | D-9 |
| Example 10 | Planographic printing plate precursor 10 | D-10 |
| Example 11 | Planographic printing plate precursor 11 | D-11 |
| Example 12 | Planographic printing plate precursor 12 | D-12 |

Comparative Example 1

A planographic printing plate precursor 13 was obtained in the same manner as in Example 1 except that in the photosensitive solution 1 of Example 1, m,p-cresol novolak (m/p ratio=6/4, weight average molecular weight 3,500, containing 0.5% by weight of unreacted cresol) was used in an amount of 0.474 g and the specific phenol compound (D-1) was not used.

Comparative Example 2

A planographic printing plate precursor 14 was obtained in the same manner as in Example 2 except that in the photosensitive solution 2 of Example 2, m,p-cresol novolak (m/p ratio=6/4, weight average molecular weight 3,500, containing 0.5% by weight of unreacted cresol) was used in an amount of 2.25 g and the specific phenol compound (D-2) was not used.

Comparative Example 3

A planographic printing plate precursor 15 was obtained in the same manner as in Example 1 except that a phenol compound having no bulky substituent at the o-position as shown below was used instead of the specific phenol compound (D-1) in the photosensitive solution 1 of Example 1.

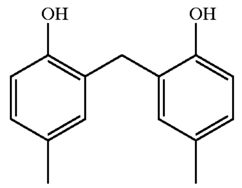

Evaluation of a Planographic Printing Plate Precursor

Test for the Scratch Resistance

The planographic printing plate precursors 1 to 12 of the present invention and the planographic printing plate precursors 13 to 15 obtained by Comparative Examples were subjected to rubbing 30 times under a load of 250 g with an abrasion felt CS5 using a rotary abrasion tester (manufactured by Toyo Seild Co., Ltd.).

Subsequently, they were developed at a liquid temperature of 30° C. for a developing duration of 12 seconds using PS Processor 900 H (manufactured by Fuji Photo Film Co., Ltd.) charged with a developing solution DT-1 (diluted at 1:8) manufactured by Fuji Photo Film Co., Ltd. and a finisher FP2W (diluted at 1:1) manufactured by Fuji Photo Film Co., Ltd. At this time, a conductivity of the developing solution was 45 mS/cm.

The surface of the planographic printing plate formed after the development was visually observed and evaluated for the scratch resistance according to the following criteria.

○: No change found in an optical density of a photosensitive film at a rubbed portion.

Δ: A slight decrease observed visually in an optical density of a photosensitive film at a rubbed portion.

X: An optical density of a photosensitive film at a rubbed portion lowered to below ⅔ of the value measured at a non-rubbed portion.

In the plate without any decrease in the optical density observed at the rubbed portion, it is considered that the image area was not affected by scratches and the scratch resistance was good.

The results obtained by evaluating the scratch resistance are shown in Table 6 below.

Evaluation of Development Latitude

In the planographic printing plate precursors 1 to 12 of the present invention and the planographic printing plate precursors 13 to 15 obtained by Comparative Examples, a test pattern was imagewise drawn using Trendsetter manufactured by Creo at a beam intensity of 9 w and a drum rotational speed of 150 rpm.

First, the planographic printing plate precursors 1 to 15 having been exposed under the foregoing conditions were developed at a liquid temperature of 30° C. for a developing duration of 12 seconds using PS Processor 900 H (manufactured by Fuji Photo Film Co., Ltd.) charged with a developing solution DT-1 (diluted at 1:9 and 1:10) manufactured by Fuji Photo Film Co., Ltd. and a finisher FP2W (diluted at 1:1) manufactured by Fuji Photo Film Co., Ltd. At this time, conductivities of the developing solutions were 41 mS/cm and 39 mS/cm, respectively.

Contamination or coloration arising from a residual layer of a recording layer caused by unsatisfactory development was visually inspected in the exposed area after the development. It was found that when using a developing solution DT-1 diluted at 1:9, contamination in the non-image area was not observed in any of the planographic printing plates, showing the good developability. However, when using a developing solution DT-1 diluted at 1:10, contamination in the non-image area was observed in all of the planographic printing plates. From the above, it was confirmed that the planographic printing plate precursors 1 to 15 exhibited almost the same degree of developability in the exposed areas.

Subsequently, the planographic printing plate precursors 1 to 15 having been exposed under the foregoing conditions were developed at a liquid temperature of 30° C. for a developing duration of 12 seconds using PS Processor 900 H (manufactured by Fuji Photo Film Co., Ltd.) charged with a developing solution DT-1 (diluted at 1:6.5) manufactured by Fuji Photo Film Co., Ltd. and a finisher FP2W (diluted at 1:1) manufactured by Fuji Photo Film Co., Ltd. At this time, a conductivity of the developing solution was 52 mS/cm.

The optical density at the unexposed area (image area) of the photosensitive layer in the resulting planographic printing plates after the development was visually evaluated, and compared with the optical density of those developed with the developing solution having been diluted at 1:9. The evaluation was conducted according to the following criteria.

○: No decrease in an optical density confirmed visually.

X: Decrease in an optical density detected.

By the way, in the plate without any decrease in the optical density observed at the unexposed area, it is considered that the image area was not dissolved by the developing solution having a higher activity, thus revealing that the samples in which a decrease in an optical density was not observed at the unexposed area had a large latitude over a wide range of the developer activity.

The results are shown in Table 6 below.

Evaluation of Storability with the Passing of Time

The planographic printing plate precursors 1 to 12 of the present invention and the planographic printing plate precursors 13 to 15 obtained by Comparative Examples were stored in an atmosphere of temperature of 35° C. and humidity of 45% RH for 3 days. The scratch resistance and the optical density were evaluated in the same manner as described above.

The results are shown together with the foregoing results in Table 6 below.

TABLE 6

| | | Before storage with the passing of time | | After storage with the passing of time | |
|---|---|---|---|---|---|
| | | Scratch resistance | Decrease in optical density | Scratch resistance | Decrease in optical density |
| Ex. 1 | Planographic printing plate precursor 1 | ○ | ○ | ○ | ○ |
| Ex. 2 | Planographic printing plate precursor 2 | ○ | ○ | ○ | ○ |
| Ex. 3 | Planographic printing plate precursor 3 | ○ | ○ | ○ | ○ |
| Ex. 4 | Planographic printing plate precursor 4 | ○ | ○ | ○ | ○ |
| Ex. 5 | Planographic printing plate precursor 5 | ○ | ○ | ○ | ○ |
| Ex. 6 | Planographic printing plate precursor 6 | ○ | ○ | ○ | ○ |
| Ex. 7 | Planographic printing plate precursor 7 | ○ | ○ | ○ | ○ |
| Ex. 8 | Planographic printing plate precursor 8 | ○ | ○ | ○ | ○ |
| Ex. 9 | Planographic printing plate precursor 9 | ○ | ○ | ○ | ○ |
| Ex. 10 | Planographic printing plate precursor 10 | ○ | ○ | ○ | ○ |
| Ex. 11 | Planographic printing plate precursor 11 | ○ | ○ | ○ | ○ |
| Ex. 12 | Planographic printing plate precursor 12 | ○ | ○ | ○ | ○ |
| Comp. Ex. 1 | Planographic printing plate precursor 13 | Δ | X | X | X |
| Comp. Ex. 2 | Planographic printing plate precursor 14 | X | X | X | X |
| Comp. Ex. 3 | Planographic printing plate precursor 15 | Δ | X | X | X |

As is clear from Table 6 above, the planographic printing plate precursors obtained with the image-forming material of the present invention exhibited good scratch resistance in comparison with the plates obtained by Comparative Examples 1 to 3 which were produced without using the specific phenol compound having a bulky substituent at the o-position. Further, no residual layer was produced at the non-image area, developability was good, and no decrease in the optical density was observed at the image area, revealing that good development latitude was exhibited.

Further, the planographic printing plate precursors obtained with the image-forming material of the present invention, even after having been stored in a severe atmosphere of high temperature and high humidity, exhibited good scratch resistance and good development latitude, thus confirming good storability with the passing of time. In contrast, as seen from the results of Comparative Examples 1 and 3, there was a tendency that the planographic printing plates produced from the image-forming material without using the specific phenol compound having a bulky substituent at the o-position produced rather lowered scratch resistance with the passing of time.

Example 13

The following photosensitive solution 3 was coated on the same substrate as used in Example 1, and the resulting plate was dried at 130° C. for 1 minute to form a first photosensitive layer. The coating amount after dried was 0.8 g/$m^2$.

| [Photosensitive solution 3] | |
|---|---|
| specific copolymer described in JP-A No. 11-288,093 | 1.2 g |
| fluorine-based surfactant (MEGAFAC F176PF made by Dainippon Ink And Chemicals, Inc.) | 0.03 g |
| γ-butyrolactone | 8 g |
| methyl ethyl ketone | 4 g |
| 1-methoxy-2-propanol | 4 g |

The following photosensitive solution 4 was coated on the first photosensitive layer formed as above, followed by drying at 100° C. for 90 seconds to form a second photosensitive layer, so as to produce a planographic printing plate precursor 13. The coating amount after dried was 0.2 g/$m^2$.

| [Photosensitive solution 4] | |
|---|---|
| m,p-cresol novolak (m/p ratio = 6/4, weight average molecular weight 500, containing 0.5% by weight of unreacted cresol) | 0.213 g |
| specific phenol compound (D-1) | 0.023 g |
| dye in which a counter anion of Victoria Pure Blue BOH is 1-naphthalenesulfonic acid | 0.01 g |
| fluorine-based surfactant (MEGAFAC F176PF made by Dainippon Ink And Chemicals, Inc.) | 0.02 g |
| fluorine-based surfactant (MEGAFAC MCF-312 made by Dainippon Ink And Chemicals, Inc.) | 0.015 g |
| methyl ethyl ketone | 8 g |
| 1-methoxy-2-propanol | 7 g |

The thus produced planographic printing plate precursor 16 of the present invention was evaluated for the development latitude, the scratch resistance and the storability with the passing of time in the same manner as conducted for the planographic printing plate precursors 1–15. Score ○ was achieved in all of the evaluation items, revealing that the planographic printing plate precursors produced by using the image-forming material of the present invention as the recording layer of a multilayer structure were also excellent, like those having the recording layer of a monolayer structure, in all of the properties of the development latitude, the scratch resistance and the storability with the passing of time.

Accordingly, the present invention provides a positive-type image-forming material which is excellent in latitude during image-forming through development, the scratch resistance and the storability. Also, the present invention provides the planographic printing plate precursor, using the same as the recording layer, which achieves direct plate-making with an infrared laser and exerts such advantageous effects that latitude during image-forming through development, the scratch resistance and the storability with the passing of time are excellent.

What is claimed is:

1. A heat mode-compatible positive-type image-forming material comprising (a) a water-insoluble, aqueous alkaline solution-soluble polymer compound, (b) a light-heat converting agent and (c) a phenol represented by the following formulas (III) and (IV), the positive-type image-forming material exhibiting an increase in solubility in an aqueous alkaline solution when the positive-type image-forming material is heated:

Formula (III)

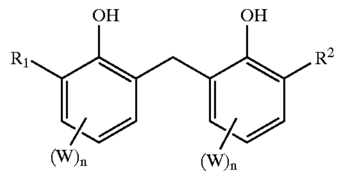

Formula (IV)

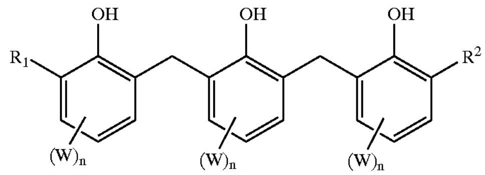

wherein:

$R^1$ and $R^2$ may be the same or different, and at least one of $R^1$ and $R^2$ represents a monovalent organic group having 3 or more carbon atoms;

W represents a monovalent terminal group; and n represents an integer of 1 to 4, but if n is 2 or more, the groups represented by W may be the same or different and may be connected to each other via a linking group.

2. A heat mode-compatible positive-type image-forming material comprising (a) a water-insoluble, aqueous alkaline solution-soluble polymer compound, (b) a light-heat converting agent and (c) a phenol selected from the phenol compounds including a partial structure represented by the following formulas (XIV), the positive-type image-forming material exhibiting an increase in solubility in an aqueous alkaline solution when the positive-type image-forming material is heated:

Formula (XIV)

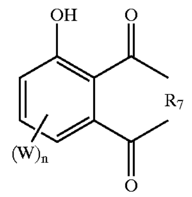

wherein:

$R^7$ represents an alkyl group having 1 to 20 carbon atoms;

W represents a monovalent terminal group; and n represents an integer of 1 to 4, but if n is 2 or more, the groups represented by W may be the same or different and may be connected to each other via a linking group.

3. A heat mode-compatible positive-type image-forming material comprising (a) a water-insoluble, aqueous alkaline solution-soluble polymer compound, (b) a light-heat converting agent and (c) a phenol selected from the phenol compounds including a partial structure represented by the following formula (V) or (VI), the positive-type image-forming material exhibiting an increase in solubility in an aqueous alkaline solution when the positive-type image-forming material is heated:

Formula (V)

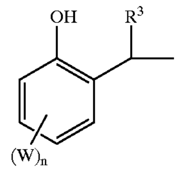

Formula (VI)

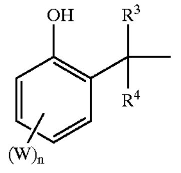

wherein:

$R^3$ and $R^4$, may be the same or different, each represent a monovalent organic group;

W represents a monovalent terminal group; and n' represents an integer of 1 to 4, but if n' is 2 or more, the groups represented by W may be the same or different and may be connected to each other via a linking group.

4. A heat mode-compatible positive-type image-forming material comprising (a) a water-insoluble, aqueous alkaline solution-soluble polymer compound, (b) a light-heat converting agent and (c) a phenol selected from the group consisting of phenol compounds represented by the following formulas (VII) and (VIII), the positive-type image-forming material exhibiting an increase in solubility in an aqueous alkaline solution when the positive-type image-forming material is heated:

Formula (VII)

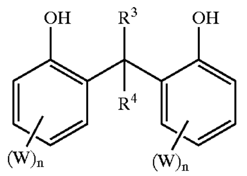

Formula (VIII)

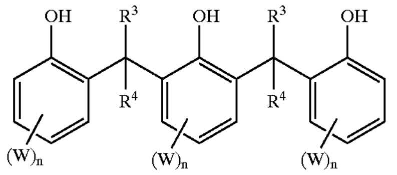

wherein:

$R^3$ and $R^4$, which may be the same or different, each represent a hydrogen atom or a monovalent organic group, but $R^3$ and $R^4$ are not both a hydrogen atom;

W represents a monovalent terminal group; and n represents an integer of 1 to 4 , but if n is 2 or more, the groups represented by W may be the same or different and may be connected to each other via a linking group.

5. A heat mode-compatible positive-type image-forming material comprising (a) a water-insoluble, aqueous alkaline solution-soluble polymer compound, (b) a light-heat converting agent and (c) a phenol selected from the phenol compounds including a partial structure represented by the following formula (IX), the positive-type image-forming material exhibiting an increase in solubility in an aqueous alkaline solution when the positive-type image-forming material is heated:

Formula (IX)

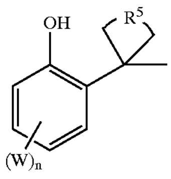

wherein:

$R^5$ represents a divalent organic group;

W represents a monovalent terminal group; and n' represents an integer of 1 to 4, but if n' is 2 or more, the groups represented by W may be the same or different and may be connected to each other via a linking group.

6. A heat mode-compatible positive-type image-forming material comprising (a) a water-insoluble, aqueous alkaline solution-soluble polymer compound, (b) a light-heat converting agent and (c) a phenol selected from the phenol compounds including a partial structure represented by the following formula (IX), the positive-type image-forming material exhibiting an increase in solubility in an aqueous alkaline solution when the positive-type image-forming material is heated:

Formula (IX)

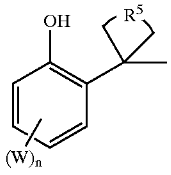

wherein:

$R^5$ represents a divalent organic group having 3 to 6 carbon atoms;

W represents a monovalent terminal group; and n' represents an integer of 1 to 4, but if n' is 2 or more, the groups represented by W may be the same or different and may be connected to each other via a linking group.

7. A heat mode-compatible positive-type image-forming material comprising (a) a water-insoluble, aqueous alkaline solution-soluble polymer compound, (b) a light-heat converting agent and (c) a phenol selected from the phenol compounds represented by the following formulas (X) and (XI), the positive-type image-forming material exhibiting an increase in solubility in an aqueous alkaline solution when the positive-type image-forming material is heated:

Formula (X)

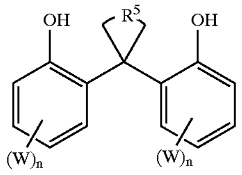

Formula (XI)

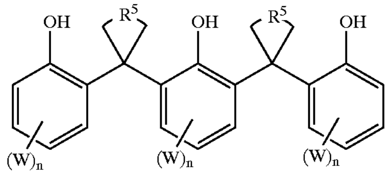

wherein:

$R^5$ represents a divalent organic group;

W represents a monovalent terminal group; and n represents an integer of 1 to 4, but if n is 2 or more, the groups represented by W may be the same or different and may be connected to each other via a linking group.

8. A heat mode-compatible positive-type image-forming material comprising (a) a water-insoluble, aqueous alkaline solution-soluble polymer compound, (b) a light-heat converting agent and (c) a phenol selected from the phenol compounds represented by the following formulas (X) and (XI), the positive-type image-forming material exhibiting an increase in solubility in an aqueous alkaline solution when the positive-type image-forming material is heated:

Formula (X)

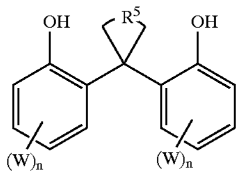

Formula (XI)

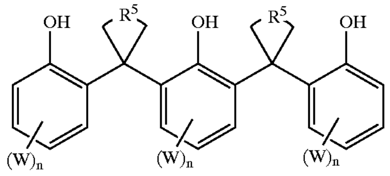

wherein:

$R^5$ represents a divalent organic group having 3 to 6 carbon atoms;

W represents a monovalent terminal group; and n represents an integer of 1 to 4, but if n is 2 or more, the groups represented by W may be the same or different and may be connected to each other via a linking group.

9. A heat mode-compatible positive-type image-forming material comprising (a) a water-insoluble, aqueous alkaline solution-soluble polymer compound, (b) a light-heat converting agent and (c) a phenol represented by the following D-1 to D-12, the positive-type image-forming material exhibiting an increase in solubility in an aqueous alkaline solution when the positive-type image-forming material is heated:

D-1

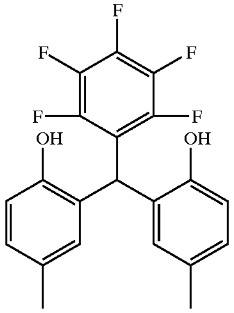

D-2

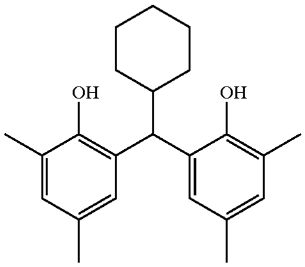

D-3

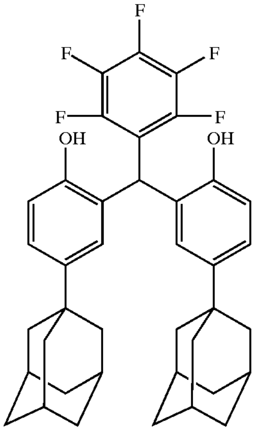

D-4

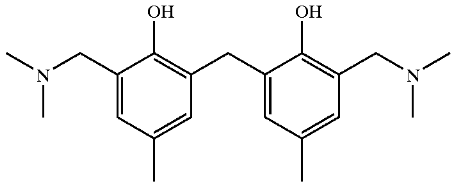

D-5

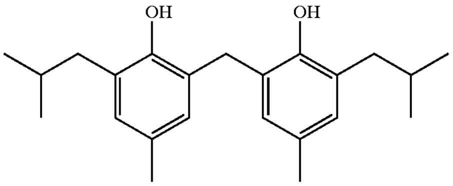

D-6

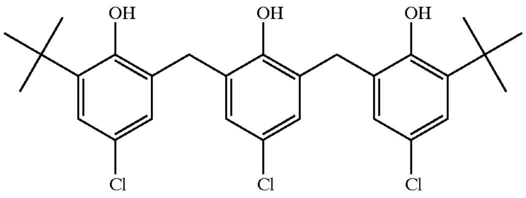

-continued

D-7

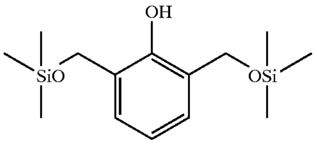

D-8

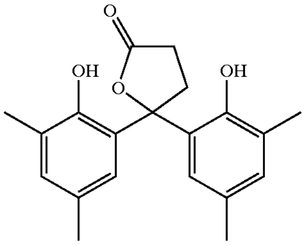

D-9

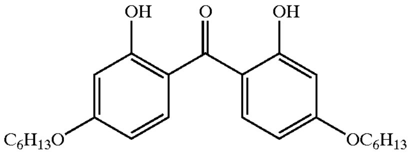

D-10

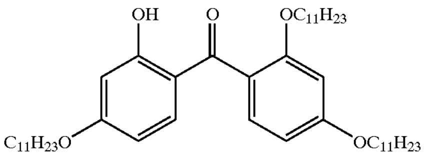

D-11

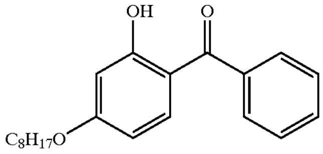

D-12

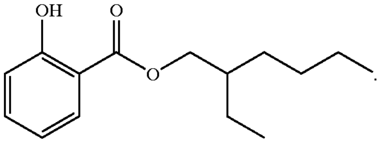

10. A planographic printing plate precursor which comprises, on a substrate, a recording layer which includes a positive-type image-forming material including: (a) a water-insoluble, aqueous alkaline solution-soluble polymer compound, (b) a light-heat converting agent and (c) a phenol including a partial structure represented by the following formulas (III) and (IV), the positive-type image-forming material exhibiting an increase in solubility in an aqueous alkaline solution when the positive-type image-forming material is heated:

Formula (III)

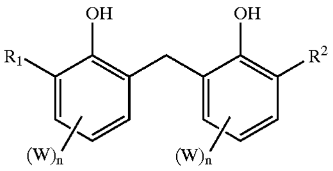

-continued

Formula (IV)

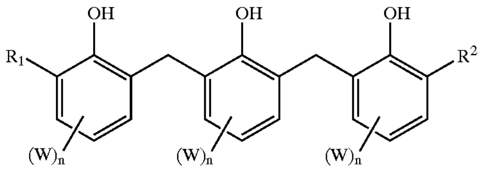

wherein:

$R^1$ and $R^2$ may be the same or different, and at least one of $R^1$ and $R^2$ represents a monovalent organic group having 3 or more carbon atoms;

W represents a monovalent terminal group; and n represents an integer of 1 to 4, but if n is 2 or more, the groups represented by W may be the same or different and may be connected to each other via a linking group.

11. A planographic printing plate precursor which comprises, on substrate, a recording layer which includes a positive-type image-forming material including: (a) a water-insoluble, aqueous alkaline solution-soluble polymer compound, (b) a light-heat converting agent and (c) a phenol selected from the phenol compounds including a partial structure represented by the following formula (XIV), the positive-type image-forming material exhibiting an increase in solubility in an aqueous alkaline solution when the positive-type image-forming material is heated Formula (XIV)

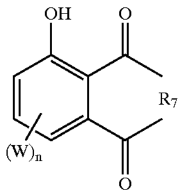

wherein:

$R^7$ represents an alkyl group having 1 to 20 carbon atoms;

W represents a monovalent terminal group; and n represents an integer of 1 to 4, but if n is 2 or more, the groups represented by W may be the same or different and may be connected to each other via a linking group.

12. A planographic printing plate precursor which comprises, on substrate, a recording layer which includes a positive-type image-forming material including: (a) a water-insoluble, aqueous alkaline solution-soluble polymer compound, (b) a light-heat converting agent and (c) a phenol selected from the phenol compounds including a partial structure represented by the following formula (V) or (VI), the positive-type image-forming material exhibiting an increase in solubility in an aqueous alkaline solution when the positive-type image-forming material is heated:

Formula (V)

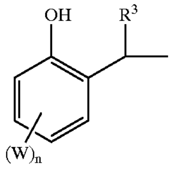

-continued

Formula (VI)

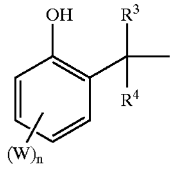

wherein:

$R^3$ and $R^4$, may be the same or different, each represent a monovalent organic group;

W represents a monovalent terminal group; and n' represents an integer of 1 to 4, but if n' is 2 or more, the groups represented by W may be the same or different and may be connected to each other via a linking group.

13. A planographic printing plate precursor which comprises, on substrate, a recording layer which includes a positive-type image-forming material in including: (a) a water-insoluble, aqueous alkaline solution-soluble polymer compound, (b) a light-heat converting agent and (c) a phenol selected from the group consisting of phenol compounds represented by the following formulas (VII) and (VIII), the positive-type image-forming material exhibiting an increase in solubility in an aqueous alkaline solution when the positive-type image-forming material is heated:

Formula (VII)

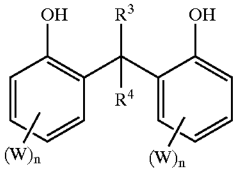

Formula (VIII)

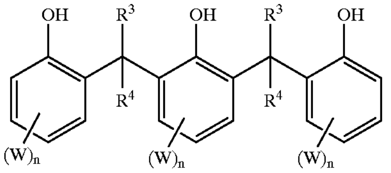

wherein:

$R^3$ and $R^4$, which may be the same or different, each represent a hydrogen atom or a monovalent organic group, but $R^3$ and $R^4$ are not both a hydrogen atom;

W represents a monovalent terminal group; and n represents an integer of 1 to 4, but if n is 2 or more, the groups represented by W may be the same or different and may be connected to each other via a linking group.

14. A planographic printing plate precursor which comprises, on substrate, a recording layer which includes a positive-type image-forming material including: (a) a water-insoluble, aqueous alkaline solution-soluble polymer compound, (b) a light-heat converting agent and (c) a phenol selected from the phenol compounds including a partial structure represented by the following formula (IX), the positive-type image-forming material exhibiting an increase in solubility in an aqueous alkaline solution when the positive-type image-forming material is heated:

Formula (IX)
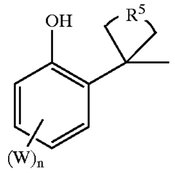
wherein:
$R^5$ represents a divalent organic group;
W represents a monovalent terminal group; and
n' represents an integer of 1 to 4, but if n' is 2 or more, the groups represented by W may be the same or different and may be connected to each other via a linking group.
* * * * *